United States Patent
Dasgupta et al.

(10) Patent No.: US 10,658,471 B2
(45) Date of Patent: May 19, 2020

(54) TRANSITION METAL DICHALCOGENIDES (TMDCS) OVER III-NITRIDE HETEROEPITAXIAL LAYERS

(71) Applicant: Intel Corporation, Santa Clara, CA (US)

(72) Inventors: Sansaptak Dasgupta, Hillsboro, OR (US); Han Wui Then, Portland, OR (US); Marko Radosavljevic, Portland, OR (US); Niloy Mukherjee, Portland, OR (US); Ravi Pillarisetty, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/771,985

(22) PCT Filed: Dec. 24, 2015

(86) PCT No.: PCT/US2015/000493
§ 371 (c)(1),
(2) Date: Apr. 27, 2018

(87) PCT Pub. No.: WO2017/111869
PCT Pub. Date: Jun. 29, 2017

(65) Prior Publication Data
US 2018/0350921 A1   Dec. 6, 2018

(51) Int. Cl.
*H01L 29/267* (2006.01)
*H01L 27/092* (2006.01)
(Continued)

(52) U.S. Cl.
CPC ...... *H01L 29/267* (2013.01); *H01L 21/02381* (2013.01); *H01L 21/02433* (2013.01);
(Continued)

(58) Field of Classification Search
CPC .......... H01L 21/02568; H01L 21/0262; H01L 21/02422; H01L 29/7782; H01L 29/24;
(Continued)

(56) References Cited

U.S. PATENT DOCUMENTS

| 6,121,153 A | 9/2000 | Kikkawa |
| 6,225,196 B1 | 5/2001 | Yokoyama |

(Continued)

FOREIGN PATENT DOCUMENTS

| CN | 1279733 | 1/2001 |
| CN | 102576663 | 7/2012 |

(Continued)

OTHER PUBLICATIONS

International Preliminary Report on Patentability from PCT/US2015/000493 dated Jul. 5, 2018, 6 pgs.

(Continued)

*Primary Examiner* — Sue A Purvis
*Assistant Examiner* — Scott Stowe
(74) *Attorney, Agent, or Firm* — Green, Howard & Mughal LLP

(57) ABSTRACT

Described herein are methods and structures integrating one or more TMDC crystal heteroepitaxially grown on one or more group III-Nitride (III-N) crystal. The TMDC crystal may be grown on a III-N heteroepitaxial crystal that has been grown on crystalline silicon substrate. One or more of III-N devices and silicon devices employing separated regions of the heteroepitaxial substrate may be integrated with a TMDC device fabricated on with the TMDC crystal. In some embodiments, impurity-doped III-N source/drain regions provide a low resistance coupling between metallization and a TMDC-channeled transistor.

18 Claims, 13 Drawing Sheets

(51) Int. Cl.
    *H01L 29/786* (2006.01)
    *H01L 27/12* (2006.01)
    *H01L 21/8258* (2006.01)
    *H01L 21/02* (2006.01)
    *H01L 21/8238* (2006.01)
    *H01L 29/778* (2006.01)

(52) U.S. Cl.
    CPC .. *H01L 21/02458* (2013.01); *H01L 21/02494* (2013.01); *H01L 21/02502* (2013.01); *H01L 21/02516* (2013.01); *H01L 21/02568* (2013.01); *H01L 21/02609* (2013.01); *H01L 21/8258* (2013.01); *H01L 21/823821* (2013.01); *H01L 27/0924* (2013.01); *H01L 27/1207* (2013.01); *H01L 27/1211* (2013.01); *H01L 29/7787* (2013.01); *H01L 29/78681* (2013.01)

(58) Field of Classification Search
    CPC ............. H01L 29/66969; H01L 29/267; H01L 29/78681; H01L 29/7787
    See application file for complete search history.

(56) References Cited

U.S. PATENT DOCUMENTS

| | | |
|---|---|---|
| 6,261,929 B1 | 7/2001 | Gehrke et al. |
| 6,325,850 B1 | 12/2001 | Beaumont et al. |
| 6,608,327 B1 | 8/2003 | Davis et al. |
| 6,617,668 B1 | 9/2003 | Koide et al. |
| 7,952,150 B1 | 5/2011 | Wohlmuth |
| 8,173,551 B2 | 5/2012 | Bai et al. |
| 8,507,304 B2 | 8/2013 | Kryliouk et al. |
| 8,530,978 B1 | 9/2013 | Chu et al. |
| 8,569,769 B2 | 10/2013 | Hwang et al. |
| 8,629,477 B2 | 1/2014 | Lochtefeld et al. |
| 8,836,016 B2 | 9/2014 | Wu et al. |
| 9,000,485 B2 | 4/2015 | Lee et al. |
| 9,117,777 B2 | 8/2015 | Vincent et al. |
| 9,153,583 B2 | 10/2015 | Glass et al. |
| 9,196,709 B2 | 11/2015 | Lee et al. |
| 9,240,410 B2 | 1/2016 | Then et al. |
| 2001/0040246 A1 | 11/2001 | Ishii |
| 2002/0110989 A1 | 8/2002 | Yamaguchi et al. |
| 2002/0152952 A1 | 10/2002 | Beaumont |
| 2003/0045017 A1 | 3/2003 | Hiramatsu et al. |
| 2004/0029365 A1 | 2/2004 | Linthicum et al. |
| 2004/0169192 A1 | 9/2004 | Kato et al. |
| 2006/0084245 A1 | 4/2006 | Khoda |
| 2006/0181828 A1 | 8/2006 | Sato |
| 2006/0197129 A1 | 9/2006 | Wohlmuth |
| 2007/0045670 A1 | 3/2007 | Kuraguchi |
| 2007/0278507 A1 | 12/2007 | Nakazawa et al. |
| 2008/0036038 A1 | 2/2008 | Hersee et al. |
| 2008/0070355 A1 | 3/2008 | Lochtefeld et al. |
| 2008/0093622 A1 | 4/2008 | Li |
| 2008/0099785 A1 | 5/2008 | Bai |
| 2008/0197358 A1 | 8/2008 | Frahm et al. |
| 2009/0039361 A1 | 2/2009 | Li |
| 2009/0267078 A1 | 10/2009 | Mishra et al. |
| 2010/0012976 A1 | 1/2010 | Hydrick et al. |
| 2010/0012977 A1 | 1/2010 | Derluyn et al. |
| 2010/0068866 A1 | 3/2010 | Yu et al. |
| 2010/0072575 A1 | 3/2010 | Arena |
| 2010/0140735 A1 | 6/2010 | Bommena et al. |
| 2010/0207138 A1 | 8/2010 | Nakahata et al. |
| 2010/0213511 A1 | 8/2010 | Lochtefeld |
| 2010/0219452 A1 | 9/2010 | Brierley |
| 2010/0270559 A1 | 10/2010 | Ota |
| 2011/0117726 A1 | 5/2011 | Pinnington et al. |
| 2011/0210377 A1 | 9/2011 | Haeberlen et al. |
| 2011/0272740 A1 | 11/2011 | Umeda et al. |
| 2011/0278945 A1 | 11/2011 | Wheatley, III et al. |
| 2012/0119218 A1 | 5/2012 | Su |
| 2012/0119220 A1 | 5/2012 | Guo et al. |
| 2012/0248500 A1 | 10/2012 | Kajitana |
| 2012/0292789 A1 | 11/2012 | Sazawa |
| 2012/0305992 A1 | 12/2012 | Marino et al. |
| 2013/0015460 A1 | 1/2013 | Chen et al. |
| 2013/0015525 A1 | 1/2013 | Cheng |
| 2013/0043468 A1 | 2/2013 | Adekore |
| 2013/0043485 A1 | 2/2013 | Ueno |
| 2013/0049013 A1 | 2/2013 | Shimada |
| 2013/0105810 A1 | 5/2013 | Nishimori et al. |
| 2013/0228809 A1 | 9/2013 | Chang et al. |
| 2013/0270579 A1 | 10/2013 | Yu et al. |
| 2013/0271208 A1 | 10/2013 | Then et al. |
| 2013/0307513 A1 | 11/2013 | Then et al. |
| 2013/0313561 A1 | 11/2013 | Suh |
| 2013/0320353 A1 | 12/2013 | Kryiouk et al. |
| 2013/0334538 A1 | 12/2013 | Saunier |
| 2014/0014966 A1 | 1/2014 | Tabatabaie et al. |
| 2014/0042446 A1 | 2/2014 | Chiang |
| 2014/0084300 A1 | 3/2014 | Okamoto |
| 2014/0091308 A1 | 4/2014 | Dasgupta et al. |
| 2014/0091310 A1 | 4/2014 | Jeon et al. |
| 2014/0091845 A1 | 4/2014 | Then et al. |
| 2014/0094223 A1 | 4/2014 | Dasgupta et al. |
| 2014/0110759 A1 | 4/2014 | Murata et al. |
| 2014/0197459 A1 | 7/2014 | Kis et al. |
| 2014/0239312 A1 | 8/2014 | Shatalov et al. |
| 2014/0252368 A1 | 9/2014 | Lee et al. |
| 2014/0264321 A1 | 9/2014 | Liang |
| 2014/0264379 A1 | 9/2014 | Kub et al. |
| 2014/0264380 A1 | 9/2014 | Kub et al. |
| 2015/0014820 A1 | 2/2015 | Renaud |
| 2015/0041820 A1 | 2/2015 | Renaud |
| 2015/0041860 A1 | 2/2015 | Nishimori et al. |
| 2015/0061075 A1 | 3/2015 | Yeh |
| 2015/0061078 A1 | 3/2015 | Abel et al. |
| 2015/0083206 A1 | 3/2015 | Novoselov et al. |
| 2015/0115325 A1 | 4/2015 | Vielemeyer |
| 2015/0144957 A1 | 5/2015 | Lu et al. |
| 2015/0206796 A1 | 7/2015 | Dasgupta et al. |
| 2015/0263223 A1 | 9/2015 | Ito |
| 2015/0318276 A1 | 11/2015 | Bayram et al. |
| 2015/0340482 A1 | 11/2015 | Padmanabhan et al. |
| 2015/0364592 A1 | 12/2015 | van Dal et al. |
| 2016/0111496 A1 | 4/2016 | Leobandung |
| 2016/0336437 A1 | 11/2016 | Kajitani et al. |
| 2016/0343805 A1 | 11/2016 | Lee et al. |
| 2017/0003248 A1 | 1/2017 | Yang et al. |
| 2017/0012117 A1 | 1/2017 | Radosavljevic et al. |
| 2017/0059514 A1 | 3/2017 | Hoffman |
| 2017/0221999 A1 | 8/2017 | Dasgupta et al. |
| 2017/0236704 A1 | 8/2017 | Dasgupta et al. |
| 2017/0278959 A1 | 9/2017 | Then et al. |
| 2018/0175184 A1 | 6/2018 | Then et al. |

FOREIGN PATENT DOCUMENTS

| | | |
|---|---|---|
| EP | 1054442 | 11/2000 |
| JP | 11243253 | 9/1999 |
| JP | 11260835 | 9/1999 |
| JP | 2001230410 | 8/2001 |
| JP | 2002249400 | 9/2002 |
| JP | 200369010 | 3/2003 |
| JP | 2007165431 | 6/2007 |
| JP | 2008004720 | 1/2008 |
| JP | 2008162888 | 7/2008 |
| JP | 2008305816 | 12/2008 |
| JP | 2009054807 | 3/2009 |
| JP | 2011049521 | 3/2011 |
| JP | 2011159795 | 8/2011 |
| JP | 2014078653 | 5/2014 |
| JP | 2014131028 | 7/2014 |
| JP | 2014192167 | 7/2016 |
| KR | 20120048244 | 5/2012 |
| KR | 20130046249 | 5/2013 |
| KR | 1020140037702 | 3/2014 |
| KR | 101410092 | 6/2014 |

(56) References Cited

FOREIGN PATENT DOCUMENTS

| | | |
|---|---|---|
| WO | 2011064997 | 6/2011 |
| WO | 2015047355 | 4/2015 |
| WO | 2016209263 | 12/2016 |

OTHER PUBLICATIONS

International Search Report and Written Opinion for International Patent Application No. PCT/US17/40030, dated Mar. 15, 2018.

International Search Report for PCT Application No. PCT/US15/00493 dated Aug. 24, 2016, 5 pages.

Gupta et al. "Layered Transition Metal Dichalcogenides: Promising Near-Lattice-Matched Substrates for GaN Growth" Scientific Reports vol. 6, Article No. 23708 (2016), doi:10.1038/srep23708.

Guo, Jia et al., "MBE-Regrown Ohmics in InAlN HEMTs With a Regrowth Interface Resistance of 0.05Ω * mm", IEEE Electron Device Letters, vol. 33, No. 4, Apr. 2012, 3 pgs.

Hahn, H et al., "First monolithic integration of GaN-based enhancement mode n-channel and p-channel heterostructure field effect transistors", 72nd Device Research Conference, Jun. 2014 (Jun. 2014), pp. 59-260, XP055155997, DOI: 10.1109/DRC.2014.6872396 ISBN: 978-1-47-995405-6.

Masui, Hisashi et al., "Geometrical Characteristics and Surface Polarity of Inclined Crystallographic Plane of the Wurzite and Zincblende Structures", Journal of Electronic Materials, vol. 38, No. 6, 2009.

Takei, Y et al., "Ohmic Contact Properties Depending on AlGaN Layer Thickness for AlGaN/GaN High Electron Mobility Transistor Structures", ECS Transactions, vol. 61, No. 4, Mar. 20, 2014 (Mar. 20, 2014), pp. 265-270, XP055480356, US ISSN: 1938-6737, DOI: 10.1149/06104.0265ecst.

Wan, J. et al., "Growth of Crack-Free Hexagonal GaN Films on Si (100)", Applied Physics Letters, USA, Jul. 18, 2001, Vo. 79, No. 10. p. 1459-1460, DOI: 10.1063/1.1400770.

US 10,658,471 B2

TRANSITION METAL DICHALCOGENIDES (TMDCS) OVER III-NITRIDE HETEROEPITAXIAL LAYERS

CLAIM OF PRIORITY

This Application is a National Stage Entry of, and claims priority to, PCT Application No. PCT/US15/00493, filed on 24 Dec. 2015 and titled "TRANSITION METAL DICHALCOGENIDES (TMDCS) OVER III-NITRIDE HETEROEPITAXIAL LAYERS", which is incorporated by reference in its entirety for all purposes.

BACKGROUND

Demand for integrated circuits (ICs) in portable electronic applications has motivated greater levels of semiconductor device integration. Many advanced semiconductor devices in development leverage non-silicon semiconductor materials, a subset of which have hexagonal crystallinity. One class of those materials is transition metal dichalcogenides (TMD or TMDC). Similar to graphene, TMDCs display semiconductor properties as a monolayer sheet of $MX_2$, where M is a transition metal atom (e.g., Mo, W) and X is a chalcogen atom (S, Se, or Te). In the monolayered crystalline sheet, one layer of M atoms is disposed between two layers of X atoms. TMDC materials are of significant interest as a basis for highly-scaled integrated circuitry (IC), in part because of the thin active layers possible. For example, a semiconducting $MoS_2$ monolayer has a film thickness of only 0.65 nm. A TMDC-channeled transistor would therefore have excellent short channel properties and gate electrode control. Unlike graphene, TMDC materials have been found to have a bandgap (direct) suitable for both transistors and optical devices. It has also been shown that many TMDC materials have good electron and hole mobility, which again makes them interesting for highly-scaled short channel devices (e.g., $L_g$<20 nm).

However, high-quality growth processes for TMDC compounds have been absent from the literature. To date, most TMDC materials have been obtained through non-manufacturable techniques like exfoliation (e.g., scotch tape liftoff). A few other techniques, like deposition on amorphous materials (e.g., $SiO_2$), at best yield polycrystalline films, which do not yet display satisfactory device performance.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
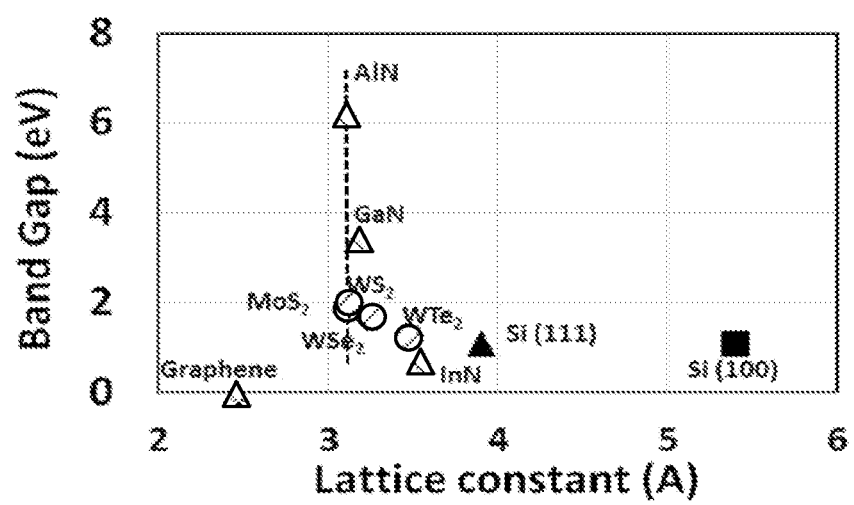
FIG. 1 is a graph of band gap as a function of c-plane lattice constant a for a few select materials, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described herein are methods and structures integrating one or more TMDC crystal heteroepitaxially grown on one or more group III-Nitride (III-N) crystal. Although in some embodiments, the TMDC crystal is grown directly on a bulk monocrystalline III-N substrate, in advantageous embodiments the TMDC crystal is grown on a heteroepitaxial III-N crystal that is grown on a substrate such as SiC, sapphire, germanium, SiGe, or III-V compound like GaAs, InP. In some exemplary embodiments however, the TMDC crystal is grown on a III-N crystal heteroepitaxially grown on a silicon crystal. For such embodiments, extensive GaN-on-silicon (GOS) technology developed by the inventors over recent years facilitates a manufacturable substrate amenable to the growth of lattice-matched TMDC crystals of high quality. Using such techniques, TMDC devices on large diameter (e.g., 300 mm/450 mm) substrates become a manufacturable reality. The GOS substrate, including wide-bandgap III-N material, is also advantageous for the excellent electrical isolation of TMDC devices from each other, and/or the substrate, and/or other devices integrated on the substrate.

The inventors also consider the TMDC-on-GOS (TMDCOGOS) heteroepitaxial substrates described herein to be an excellent universal platform for highly-scaled monolithic ICs. In addition to a high-quality TMDC layer, and large-silicon substrate-based manufacturing, the TMDCOGOS substrate offers the further advantage of monolithically integrating III-N devices suitable for high-voltage and high-frequency applications. With extensive power scaling occurring in advanced ICs, even sustaining 1.5V operating voltages has become a challenge for dimensionally scaled devices. The high-voltage domain therefore continues to expand from that of traditional power management ICs (PMICs) and RF power amplifiers (PAs) into lower-voltage domains previously employed in logic circuitry. III-N devices (e.g., high electron mobility field effect transistors) have a relatively wide bandgap (~3.4 eV), as well as high carrier mobility. III-N devices capable of higher-voltage operation therefore dovetail nicely with ultra-scaled TMDC devices. III-N photonics (e.g., LEDs), photovoltaics, and sensors, may further complement various opto-electronic TMDC devices that leverage the direct bandgap of a TMDC crystal.

The TMDCOGOS substrates described herein also offer the further advantage of monolithically integrating TMDC devices with advanced silicon-CMOS devices. As such, one or all of TMDC, III-N, and Si-based devices may be manufactured on large format TMDCOGOS substrates in accordance with one or more embodiments described herein.

According to some embodiments, the III-N semiconductor material system is employed to accommodate a large lattice mismatch between TMDC materials and silicon. The amount of TMDC epitaxial may therefore be limited to just that needed to achieve desirable semiconductor properties. Exemplary III-N and TMDC material systems both form hexagonal crystals. FIG. 1 is a graph of band gap as a function of c-plane lattice constant a for a few select materials. Many TMDC materials lattice match the a lattice parameter of GaN to within 1% (i.e., the difference in a for the two materials is no more than 1%). As shown by dashed line, AlN has nearly the same a lattice constant as exemplary TMDC materials $WS_2$, and $MoS_2$. Other exemplary TMDC materials (e.g., $WSe_2$ and $WTe_2$) fall between the lattice constants of GaN and InN. As such, TMDC materials may be substantially lattice matched (i.e., to within 1%) to a seeding surface of III-N material. In some embodiments, a III-N alloy (e.g., a GaN layer comprising a predetermined amount of In or Al) having a lattice match of 0.05%, or better, to that of a TMDC material is provided as the seeding III-N surface upon which a TMDC layer is disposed.

Figure 2A:
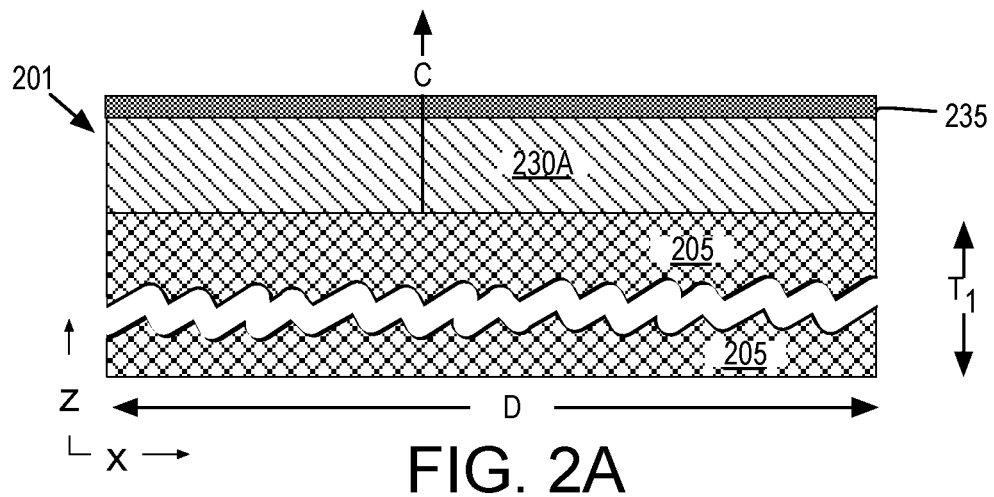
FIG. 2A is a cross-sectional view of a TMDCOGOS substrate, in accordance with some embodiments.

As further illustrated in FIG. 1, for both (111) and (100) silicon, the lattice constant a is considerably larger than that of the GaN and TMDC material systems. In some embodiments, a III-N heteroepitaxial buffer architecture is employed and a TMDC device layer is epitaxially grown over the III-N buffer. In other embodiments, III-N heteroepitaxial islands are selectively grown from a templated silicon substrate. A TMDC device layer may then be epitaxially grown over at least a portion of the III-N islands. FIG. 2A is a cross-sectional view of a TMDCOGOS substrate 201 in accordance with some embodiments.

Substrate 201 includes a crystalline TMDC layer 235 disposed on a crystalline III-N layer 230A further disposed on a crystalline silicon layer 205. Silicon layer 205 is advantageously monocrystalline (i.e., a crystal) having a predetermined crystal orientation. Crystallographic orientation of a substantially monocrystalline silicon layer 205 may be any of (100), (111), or (110). Other crystallographic orientations are also possible. In some exemplary embodiments, silicon layer 205 is (100) silicon. For a (100) silicon layer, the front side surface may advantageously miscut, or offcut, for example 2-10° toward [110], to facilitate nucleation of III-N material layers. In some exemplary embodiments, substrate diameter D is at least 300 mm and $T_1$ is approximately 775 μm (prior to thinning and dicing). In some other embodiments, substrate diameter D is 450 mm and $T_1$ is at least 900 μm (prior to thinning and dicing). Alternatively, silicon layer 205 may be a thin crystalline silicon layer disposed over a carrier material, such as, but not limited to, a second (mono) crystalline silicon layer with a dielectric layer disposed there between (e.g., a silicon SOI substrate).

Disposed on silicon layer 205 is one or more III-N layer 230A. III-N layer 230A may include any of AlN, GaN, AlGaN, InGaN, AlInGaN, and the like. In exemplary embodiments, III-N layer 230A has monocrystalline microstructure (i.e., a crystal). The microstructure of III-N layer 230A is oriented in a manner dependent on the crystal orientation of a seeding surface of silicon layer 205, and is therefore referred to as a heteroepitaxial layer. Crystal quality of III-N layer 230A may vary dramatically over its thickness as a function of the material composition and techniques employed to increase the crystal quality of III-N material layer 230A as thickness increases. For example, III-N layer 230A may have a dislocation density as high as $10^8$-$10^{11}$/cm$^2$. In some embodiments, the c-axis of III-N layer 230A is aligned approximately normal to the front-side surface of silicon layer 205. Practically however, the III-N c-axis may be slightly tilted (e.g., a few degrees less than normal), for example as a result of imperfect epitaxial growth on an offcut or off-axis substrate, etc. In some embodiments, the {000-1} plane is more proximate silicon layer 205. Such embodiments may be referred to as having Ga polarity (+c) because the three bonds of Ga (or other group III element) point towards silicon layer 205. For alternate embodiments where the three bonds of Ga (or other group III element) point in the opposite direction, III-N layer 230A would be referred to as N polarity (-c).

III-N layer 230A may vary in thickness, but in exemplary embodiments has a total thickness of at least 1 μm, advantageously at least 3 μm, and may be 5 μm, or more. In some embodiments, III-N layers 230A include an AlN nucleation layer disposed on silicon layer 205. III-N layers 230A may further include a thicker AlGaN transition layer disposed over the thinner nucleation layer and comprising one or more material layers. In the transition layer(s), the group III sub-lattice may range for example from 80-90% Al in a portion proximate to the AlN nucleation layer, down to 10-20% in a portion proximate to TMDC layer 235. In some embodiments, the transition layer comprises a superlattice structure, for example with alternating AlGaN/GaN layers. In some further embodiments, III-N layer 230A includes a GaN layer of at least 0.5 μm in thickness, for example providing electrical isolation from silicon layer 205. A III-N material layer having a group III alloy composition (Ga, In, Al) selected to match that of a particular TMDC crystal is then employed as an epitaxially seeding surface (i.e., an uppermost portion of III-N layer 230A).

In accordance with some embodiments, TMDC layer 235 is disposed on III-N layer 230A. In some embodiments, TMDC layer 235 has a composition that is lattice matched to within 1% of that of the seeding surface of the III-N layer 230A. TMDC layer 235 is a $MX_2$ compound that may comprise any transition metal (e.g., d-block and f-block groups of the periodic table) and any chalcogen (group VI/16 of the periodic table). As such, TMDC layer 235 forms a heterostructure with III-N layer 230A. In some embodiments, the transition metal comprises at least one of W, Mo, and Hf, while the chalcogen comprises at least one of S, Se, and Te. In some advantageous embodiments, TMDC layer 235 comprises one of W or Mo and one of S, Se, and Te (e.g., $WS_2$, $WSe_2$, $WTe_2$, $MoS_2$, $MoSe_2$, $MoTe_2$). The choice of metal and chalcogen may be based on the desired conductivity type of the TMDC layer 230 (e.g., $WSe_2$ p-type and $MoS_2$ n-type).

TMDC layer 235 is a monocrystalline material (i.e., a crystal). In some exemplary embodiments, TMDC layer 235 is one crystal monolayer (an atomic monolayer of metal atoms disposed between two atomic monolayers of chalcogen atoms). Such crystal monolayers have a film thickness (along their c-axis) less than 10 Å (1.0 nm), and for an exemplary $MoS_2$ monolayer, is approximately 0.65 nm. If there is more than a monolayer, TMDC layer 235 advantageously comprises an odd number of monolayers (thereby ensuring no inversion center). In the presence of lattice-matched hexagonal III-N layer 230A, TMDC layer 235 is unstrained. In alternative embodiments, a non-lattice-matched III-N alloy composition may be chosen to deliberately induce some level of strain in the TMDC layer 235.

Noting that III-N and TMDC films of high quality may be grown at high temperatures (e.g., in excess of 1000° C.), substrate 201 may be stressed into the many hundreds of MPa. As such, various stress-tuning techniques previously described by the inventors in the context of wafer-level GOS substrates may be employed to tune wafer flatness to arrive at a flat TMDCOGOS substrate condition following the heteroepitaxial growths when substrate 201 is cooled back to ambient room temperature. For example, a III-N layer (not depicted) may also be disposed on a backside of silicon material layer 205, opposite III-N layer 230A, to balance the stress resulting from CTE mismatch between silicon layer 205 and III-N layer 230A. Modulation of the composition of III-N layer 230A may also be employed as a means of stress-tuning a TMDCOGOS substrate.

Figure 2B:
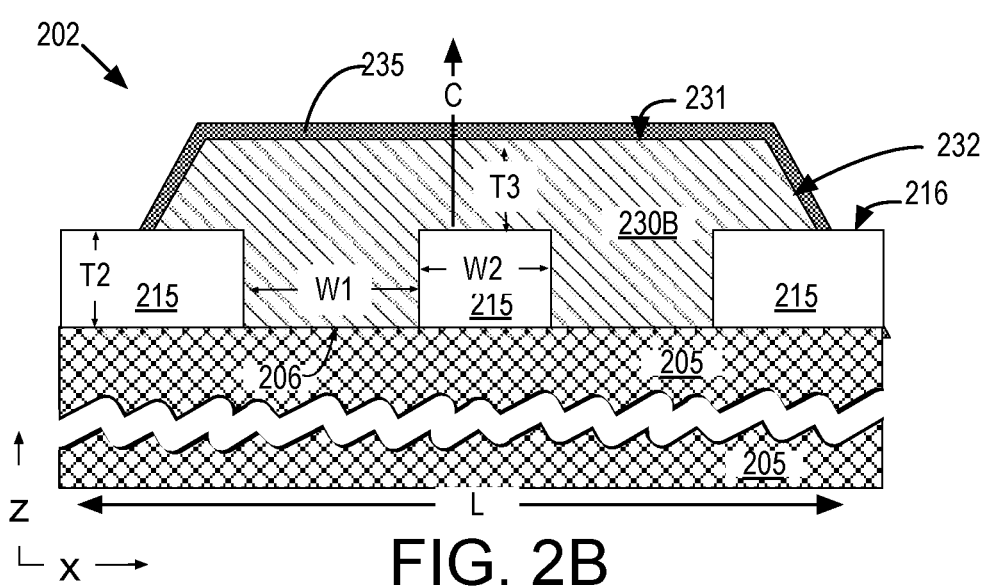
FIGS. 2B and 2C illustrate a TMDCOGOS substrate, employing selective growth of III-N islands on a templated silicon layer, in accordance with some embodiments.

FIG. 2B illustrates a TMDCOGOS substrate 202 employing selective growth of III-N islands on a templated silicon layer 205. A III-N island may have a lateral length L of a few micrometers, or less. Such embodiments may advantageously minimize film stress and/or substrate bow resulting from CTE mismatch and high temperature processing. Such embodiments may also reduce total III-N film thickness and/or growth time, and/or improve crystal quality for a given III-N film thickness relative to the TMDCOGOS substrate 201 having continuous (blanket) III-N and TMDC layers extending over the entire substrate diameter.

In some embodiments, a raised III-N crystalline body 230B, having any of the compositions described above for III-N layer 230A, is disposed within trenches formed in an amorphous material 215. III-N body 230B interfaces with silicon layer 205, having any of the compositions and material properties described above in the context of FIG. 2A. In some exemplary embodiments where a III-N composition other than GaN is lattice-matched to an overlying TMDC material, III-N body 230B includes a III-N portion having a band gap at least equal to that of GaN proximate to silicon layer 205 (e.g., a base portion of body 230B having thickness T2). Over this insulative III-N portion is a lattice-matched III-N portion (e.g., InGaN or AlGaN portion of body 230B having a thickness T3) proximate to the overlying TMDC material. The insulative portion proximate to silicon layer 205 may ensure good electrical isolation between silicon layer 205 and any device employing the TMDC material. Crystal quality of III-N layer 230B may vary over its thickness. In some embodiments, the c-axis of III-N layer(s) 230B is ideally aligned approximately normal to the front-side (100) surface of silicon layer 205. Practically however, the III-N c-axis may be slightly tilted (e.g., a few degrees less than normal), for example as a result of imperfect epitaxial growth on an offcut or off-axis substrate, etc. In some exemplary embodiments, III-N layer 230B has Ga polarity.

In some exemplary embodiments, amorphous material 215 is a dielectric, such as, but not limited to alumina ($Al_2O_3$), silica (Sift), silicon nitrides (SiN), silicon oxynitrides (SiON), silicon carbonitrides (SiCN), or polymer dielectrics (e.g., benzocyclobutene). In some embodiments, amorphous material 215 is patterned into stripes with regions of the crystalline silicon surface 206 disposed between the stripes. In one exemplary embodiment where silicon surface 206 is a (100) silicon surface, the trenches and stripes of dielectric material have their longest lengths aligned with the <110> direction of silicon layer 205.

In FIG. 2B, thickness T2 may vary widely (e.g., 10 nm-200 nm), as may width W1 (e.g., 20 nm-500 nm). Lateral width W2 may also vary significantly, for example from 100 nm to 1 μm. Raised III-N crystalline body 230B may be grown to an arbitrary height as a function of amorphous template material dimensions, epitaxial growth conditions and growth duration, etc. In some advantageously embodiments, the surface area of raised III-N body 230B is expanded beyond that of the expose crystalline silicon surface 206 through III-N lateral epitaxial overgrowth (LEO) that includes growth of a III-N material having a composition that is lattice matched to TMDC layer 235. In alternative embodiments, a non-lattice-matched III-N alloy composition may be chosen to deliberately induce some level of strain in the TMDC layer 235. The extent of lateral overgrowth over the amorphous material top surface 216 may vary with implementation, but has been found by the inventors to advantageously promote bending/gliding of defects toward III-N sidewalls 232.

As further illustrated, TDMC layer 235 is disposed over raised III-N crystalline body 232. TDMC layer 235 is advantageously monocrystalline and is disposed over a top surface 231 and/or sidewall 232 of a portion of raised crystalline III-N body 230B having a composition that is substantially lattice matched (e.g., to within 1%, or better) to that of the TDMC material. As for substrate 201, TDMC layer 235 is epitaxial, having hexagonal crystallinity and c-axis orientation derived from that of a growth-seeding surface of the underlying III-N body 230B. In exemplary embodiments, the c-axis of TDMC extends approximately normal the seeding surface of silicon layer 205. TDMC layer 235 and III-N body 230B forms a heterostructure and may include any of the transition metals described above as well as any of the chalcogens described above.

Figure 2C:
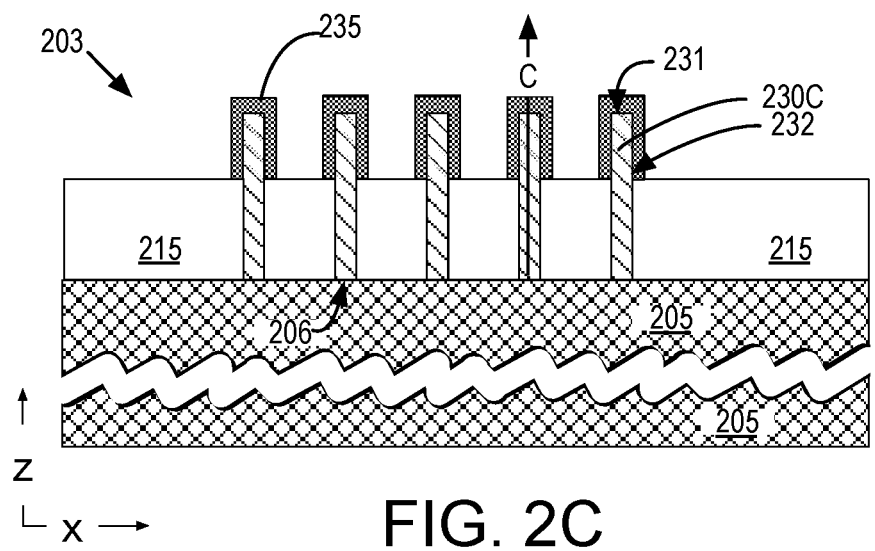

FIG. 2C illustrates a TMDCOGOS substrate 203 employing selective growth of III-N islands on a templated monocrystalline silicon layer 205. Raised III-N crystalline body 230C may have any of the compositions described above for III-N layer 230A, and is disposed within trenches formed in amorphous material 215. In exemplary embodiments where a III-N composition other than GaN is substantially lattice matched to an overlying TMDC material, III-N body 230B includes an insulative portion having a band gap at least equal to that of GaN proximate to silicon layer 205 (i.e., in a base portion of body 230B). Over the insulative portion is a lattice-matched III-N portion (e.g., InGaN or AlGaN) proximate to TMDC layer 235. In such exemplary embodiments, lateral overgrowth of III-N fins 230C may be minimized for higher III-N fin aspect ratio than for raised III-N body 230B (FIG. 2B). The higher III-N fin aspect ration may advantageously increases surface area of TMDC layer 235 for a given footprint of silicon layer 205 and is well-suited to multi-gate transistor device architectures.

In TMDCOGOS substrates 202 and 203, portions of TMDC layer 235 may be disposed on a (0001) top surface 231, and on a sidewall surface 232 that is other than a (0001) surface. In some embodiments the TMDC layer 235 is mono crystalline over both surfaces 231 and 232 (i.e., one continuous crystal of TMDC extends over both top surface 231 and sidewall surface 232). Depending on relative growth rates, a portion of TMDC layer 235 disposed over top surface 231 may have a different film thickness than a portion of TMDC layer 235 disposed over sidewall surface 232. One or both of these portions may lack an inversion center and be suitable as a device layer. In advantageous embodiments, both top surface and sidewall portions of TMDC layer 235 are suitable as a device layer such that TMDC device layer area is increased for a given substrate footprint relative to a TMDC layer disposed on a planar III-N seeding surface.

Figure 3A:
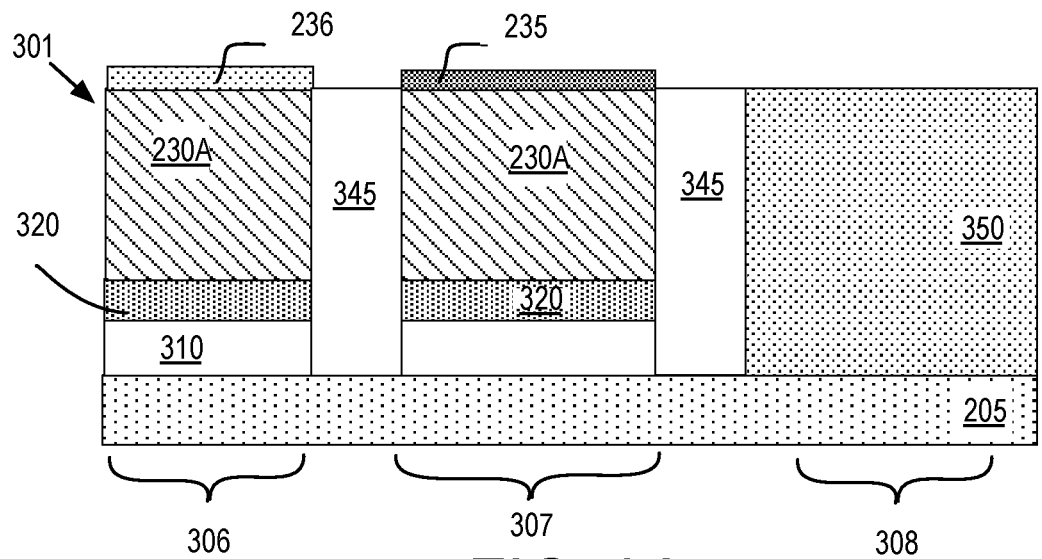
FIGS. 3A, 3B, and 3C illustrate cross-sectional views of TMDCOGOS substrates, in accordance with some embodiments.
Figure 3B:
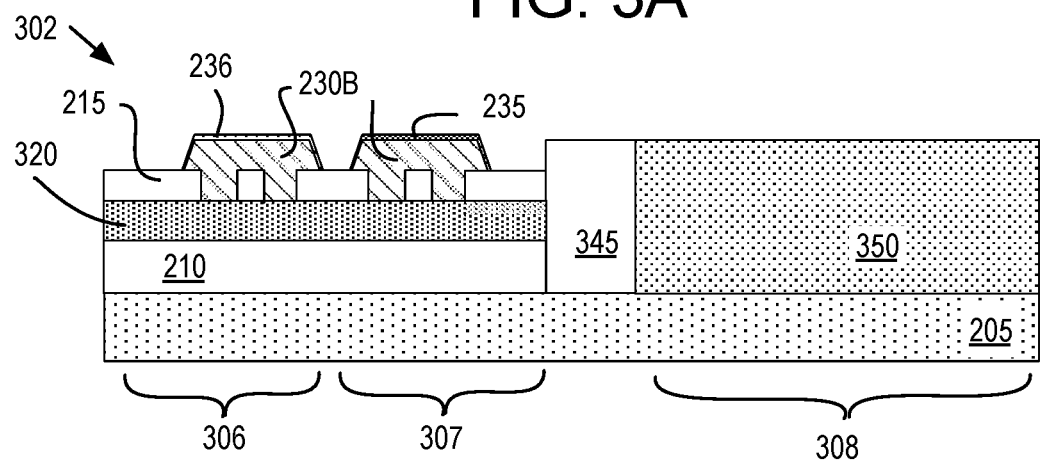
Figure 3C:
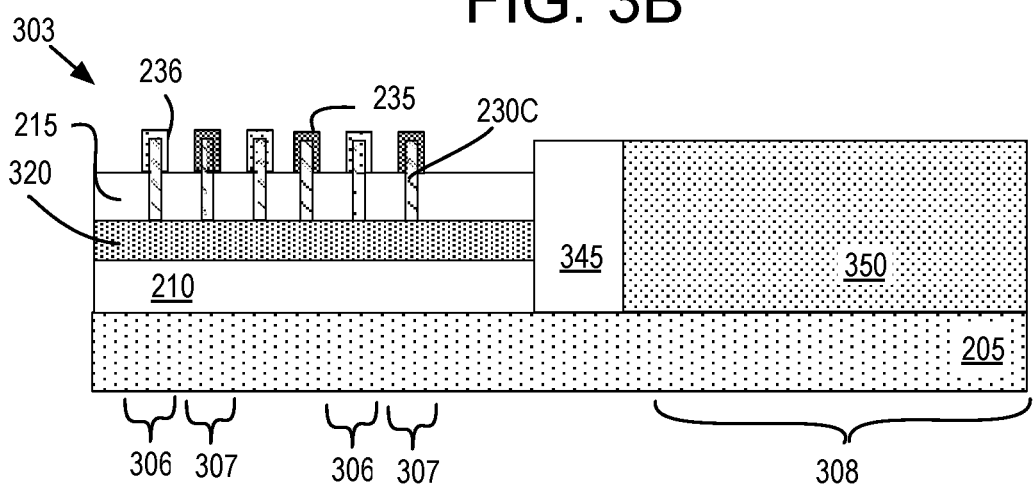

In some embodiments, a TMDCOGOS substrate further includes at least one of a III-N device layer or a silicon device layer. Such substrates advantageously facilitate integration of TMDC devices with either or both III-N devices and silicon (CMOS) field-effect transistors (FETs) on the same large-format substrate. FIG. 3A-3C are cross-sectional views of TMDCOGOS substrates in accordance with some exemplary embodiments suitable for integrating TMDC devices with both III-N devices and silicon devices. FIG. 3A-3C also illustrate use of a silicon-on-insulator (SOI) base substrate. An SOI implementation is not required however, and many of the same structural features illustrated may be readily provided in TMDCOGOS substrates incorporating a bulk silicon base substrate.

Referring first to FIG. 3A, TMDCOGOS substrate 301 includes a III-N device region 306, a TMDC device region 307, and a silicon device region 308. A (mono)crystalline silicon layer 320 is disposed over silicon layer 205 with a dielectric layer 310 disposed there between. In some embodiments, dielectric layer 310 is a buried silicon dioxide (BOX) layer. Although two silicon layers are illustrated, an SOI substrate may include more. For example, a third silicon layer may be present, each of which is insulated from the others by an intervening dielectric layer. The film thicknesses of silicon layer 320 and dielectric layer 310 may vary with implementation. The film thicknesses may be targeted, for example, to minimize non-planarity between separate regions of substrate 301. For example, the thickness of silicon layer 320 may be small (e.g., 50-500 nm) to reduce non-planarity between silicon layers 205 and 320. In another example, thickness of silicon layer 320 may be large (e.g., 2-4 nm) to match a similar thickness of epitaxial silicon material grown over a region of substrate 301 where silicon layers 210, 310 have been removed. Silicon layer 310 may therefore have a z-thickness ranging from 50 nm to 4 μm, or more. The thicknesses may also be targeted based on device performance parameters, such as levels of electrical isolation needed between circuitry formed in different regions of substrate 301. For example, in a first embodiment where an SOC is to include a high-voltage regulator in III-N device region 306, dielectric layer 310 may be thin (50-200 nm). In a second embodiment where an SOC is to include a high frequency RF power amplifier in III-N device region 306, dielectric layer 310 is advantageously thick (e.g., 1-2 μm, or more) to provide better noise isolation at high frequencies (e.g., >2 GHZ). Dielectric layer 310 may therefore have a film thickness ranging from 50 nm to 2 µm, or more.

Crystallographic orientation of silicon layers 205, 320 may each be any of (100), (111), or (110). Other crystallographic orientations are also possible. For example, for a (100) silicon orientation, the surface may be miscut or offcut, for example 2-10° toward [110]. The silicon layer 320 may have a different crystal orientation than silicon layer 205. In some embodiments, a first of silicon layers 205, 320 is (111) silicon, providing a (111) seeding surface advantageous for epitaxially growing materials with hexagonal crystallinity, such as III-N semiconductors. In some further embodiments, a second of silicon layers 205, 310 is (100) silicon, which may be advantageous for fabricating Si-based FETs. In one example illustrated by FIG. 3A, silicon layer 320 has (111) orientation while silicon layer 205 has (100) orientation. In an alternative embodiment however, silicon layer 320 has (100) orientation while silicon layer 205 has (111) orientation.

In the illustrative embodiment depicted in FIG. 3A, silicon layer 320 is (111) silicon and III-N semiconductor layer 230A is disposed directly on a (111) surface of silicon layer 320. The heteroepitaxially growth of III-N material may be confined to substrate regions 306, 307 by first patterning an amorphous mask material 345 and further patterning substrate 301 to remove silicon layer 320 and expose amorphous dielectric layer 210 within substrate region 308. In exemplary embodiments, III-N semiconductor layer 230A is substantially monocrystalline having the hexagonal c-axis substantially orthogonal to the (111) plane of silicon layer 320. In other words, the c-plane of the III-N material is no more than 10° from parallel to the (111) plane of silicon layer 320. In some exemplary embodiments, III-N semiconductor layer 230A includes a buffer layer disposed directly on silicon layer 320. The buffer may have any known architecture, with examples including a AlN nucleation and/or AlGaN intermediate layer(s) as described above. Over the buffer is an epitaxial GaN layer. Alloy species (e.g., Al, In) may be incorporated into the GaN layer. III-N semiconductor layer 230A may be grown to a z-thickness of 1-4 µm, or more.

Within substrate region 308, epitaxial raised silicon 350 is disposed over a second substrate region 205. Raised silicon 350 may be epitaxially grown from a seeding surface of silicon layer 205 subsequently exposed by removing amorphous material 310 within region 308. Raised silicon 350 may be grown to a thickness sufficient to be planar with, or extend above, a top surface of III-N semiconductor layer 230A. Using any conventional epitaxy process, raised silicon 350 may be in-situ impurity doped, for example p-type, and to a desired resistivity. Although in the exemplary embodiment silicon is grown within substrate region 308, it is noted that other materials, such as, but not limited to, SiGe, Ge, and III-V materials (e.g., InP, GaAs, GaP, InGaP, AlGaAs, etc.) may be similarly grown using any technique known to be suitable for the chosen material if devices other than Si FETs are to be hosted by substrate 301. Following epitaxial growth within substrate regions 306, 307, 308, any conventional planarization process (e.g., CMP) may be employed to planarize top surfaces of the epitaxial material within substrate regions 306, 307, 308. Following planarization, a top surface of isolation dielectric 345 is also substantially planar (e.g., to less than a hundred nanometers) with the top surface of raised silicon 350 and the top surface of III-N semiconductor layer 230A. In some embodiments where III-N material is grown on silicon layer 205 rather than silicon layer 320, epitaxial growth of raised silicon 350 may be unnecessary in the event that silicon layer 320 is of sufficient thickness to be planar with a top surface of the III-N semiconductor layer 230A.

Within substrate region 306, a polarization layer 236 is disposed directly on a layer of III-N semiconductor layer 230A. Polarization layer 236 is advantageously disposed on a GaN portion of III-N semiconductor layer 230A for high carrier mobility, however it may also be disposed on an alternative III-N material employed as the seeding surface for TMDC layer 235. If GaN is not substantially matched to TMDC layer 235, but is desired for region 306, GaN may be selectively grown along with polarization layer 236 over the III-N material employed as the seeding surface for TMDC layer 235.

In some exemplary embodiments, polarization layer 236 includes at least one of an AlGaN and/or AlN and/or AlInN layer. Polarization layer 236 may have a z-thickness of 3-30 nm, for example. Because it is disposed on the c-plane (0001) surface, polarization layer 236 induces a 2 DEG of high charge density and mobility within III-N semiconductor proximate to the interface of polarization layer 236. In the illustrative embodiment, TMDC layer 235 is disposed directly on a top surface of III-N semiconductor layer 230A within substrate region 307. TMDC layer 235 may have any of the compositions and/or film properties described above. For some such embodiments, rather than facilitating lateral device integration as shown in FIG. 3A, vertical device integration is facilitated with a TMDC layer/polarization layer stack. A TMDC-channeled transistor may then be stacked on top of a GaN-channeled transistor with polarization layer 236 disposed there between.

Any known silicon epitaxial processes, III-N epitaxial processes, and TMDC epitaxial processes (e.g., chemical vapor deposition, atomic layer deposition, and molecular beam epitaxy) may be employed to form substrate 301. While device fabrication is described in more detail below, it is noted here in the context of TMDCOGOS substrates including both a III-N device region and a TMDC device region that it is advantageous to form III-N device layers prior to forming the TMDC device layers as III-N growth temperatures may induce TMDC decomposition while TMDC growth temperatures have no detrimental effect on III-N materials. In some embodiments therefore, III-N polarization layer 236 is formed before formation of TMDC layer 235.

With the structure illustrated in FIG. 3A, substrate 301 is substantially ready to host an SOC with one or more III-N devices in region 306, one or more TMDC devices in region 307, and one or more silicon devices in region 308. Although FIG. 3A illustrates a silicon SOI base substrate to facilitate III-N growth with a (111) silicon layer, it is noted that device regions 306, 307, and 308 may also be provided on a bulk silicon substrate with a single silicon layer (e.g., layer 205). For example, both III-N semiconductor layer 230A and raised silicon 350 may be disposed on a (100) silicon seeding surface.

FIG. 3B illustrates an exemplary TMDCOGOS substrate 302 that includes III-N device region 306, TMDC device region 307, and silicon device region 308. In this exemplary embodiment, two adjacent raised III-N semiconductor bodies 230B, each having any of the properties described above, are selectively processed to have different device layers: one with TMDC layer 235; and another with polarization layer 236. For such embodiments, TMDC layer 235 may have any of the compositions and/or film properties described above, as may III-N polarization layer 236. The architecture illustrated in FIG. 3B therefore exemplifies how a selective III-N epitaxial process employing a templated silicon layer may be further selectively processed to facilitate SOC integration of both III-N devices and TMDC devices on different regions of the substrate. FIG. 3B also illustrates incorporation of a silicon SOI base substrate, including a (mono) crystalline silicon layer 320 disposed over (mono)crystalline silicon layer 205 with a dielectric layer 310 disposed there between, substantially as described above in the context of FIG. 3A. As for substrate 301, substrate 302 may alternatively include only a single silicon layer 205, for example with substrate 301 incorporating a single bulk (100) silicon base substrate.

For substrate 302, regions 306, 307 include heteroepitaxial III-N bodies 320B disposed in trenches within amorphous material 215. In the illustrative embodiment, III-N bodes 320 are disposed on a silicon layer 320 while raised silicon 350 is disposed on silicon layer 205 within substrate region 308. In exemplary embodiments, each III-N semiconductor body 230B is substantially monocrystalline having the hexagonal c-axis substantially orthogonal to the (111) plane of silicon layer 320. In other words, the c-plane of the III-N material is no more than 10° from parallel to the (111) plane of silicon layer 320.

Raised silicon 350 may be grown to a thickness sufficient to be planar with, or extend above, III-N semiconductor bodies 230B. Using any conventional epitaxy process, raised silicon 350 may be in-situ impurity doped, for example p-type, and to a desired resistivity. Although in the exemplary embodiment silicon is grown within substrate region 308, it is noted that other materials, such as, but not limited to, SiGe, Ge, and III-V materials (e.g., InP, GaAs, GaP, InGaP, AlGaAs, etc.) may be similarly grown using any technique known to be suitable for the chosen material if devices other than Si FETs are to be hosted by substrate 302.

Within substrate region 306, a polarization layer 236 is disposed directly on a layer of a III-N semiconductor body 230B. Polarization layer 236 is advantageously disposed on a GaN portion of III-N semiconductor layer 230A for high carrier mobility, however it may also be disposed on an alternative III-N material also employed as the seeding surface for TMDC layer 235. If GaN is not substantially matched to TMDC layer 235, but is desired for region 306, GaN may be selectively grown along with polarization layer 236 over the III-N material employed as the seeding surface for TMDC layer 235.

In some exemplary embodiments, polarization layer 236 includes at least one of an AlGaN and/or AlN and/or AlInN layer. Polarization layer 236 may have a z-thickness of 3-30 nm, for example. Because it is disposed on the c-plane (0001) surface, polarization layer 236 induces a 2 DEG of high charge density and mobility within III-N semiconductor body 230B proximate to the interface of polarization layer 236. Within substrate region 307, TMDC layer 235 is disposed directly on a top surface of III-N semiconductor body 230B. In some alternative embodiments, TMDC layer 235 is disposed directly on a top surface of III-N polarization layer 236, which may have been grown unselectively in both regions 306 and 307 as having a reasonably well-matched lattice parameter to that of TMDC layer 235. For some such embodiments, rather than facilitating lateral device integration as shown in FIG. 3B, vertical device integration is facilitated with a TMDC layer/polarization layer stack. A TMDC-channeled transistor may then be stacked on top of a GaN-channeled transistor with polarization layer 236 disposed there between. TMDC layer 235 may have any of the compositions and/or film properties described above.

Any known silicon epitaxial processes, III-N epitaxial processes, and TMDC epitaxial processes (e.g., CVD, ALD, and MBE) may be employed to form substrate 302. With the structure illustrated in FIG. 3B, substrate 302 is substantially ready to host an SOC with one or more III-N devices in region 306, one or more TMDC devices in region 307, and one or more silicon devices in region 308. Although FIG. 3B illustrates a silicon SOI base substrate to facilitate III-N growth with a (111) silicon layer, it is noted that device regions 306, 307, and 308 may also be provided on a bulk silicon substrate with a single silicon layer (e.g., layer 205), for example with both III-N semiconductor bodies 230B and raised silicon 350 disposed on a (100) silicon seeding surface.

FIG. 3C illustrates another exemplary TMDCOGOS substrate 303 that includes III-N device region 306, TMDC device region 307, and silicon device region 308. In this exemplary embodiment, III-N semiconductor fins 230C, having any of the properties described above, are selectively processed to have different device layers: one with TMDC layer 235; and another with polarization layer 236. For such embodiments, TMDC layer 235 may have any of the compositions and/or film properties described above, as may III-N polarization layer 236. The architecture illustrated in FIG. 3C therefore exemplifies another embodiment of selective III-N epitaxial process in which a templated silicon layer is further selectively processed to facilitate SOC integration of both III-N devices and TMDC devices on different regions of the substrate. FIG. 3C also illustrates incorporation of a silicon SOI base substrate, including a (mono)crystalline silicon layer 320 disposed over (mono) crystalline silicon layer 205 with a dielectric layer 310 disposed there between, substantially as described above in the context of FIGS. 3A and 3B. As for substrates 301 and 302, substrate 303 may alternatively include only a single silicon layer 205, for example with substrate 301 incorporating a single bulk (100) silicon base substrate.

For substrate 303, regions 306, 307 include high aspect ratio heteroepitaxial III-N fins 320C disposed in trenches within amorphous material 215. In the illustrative embodiment, III-N bodes 320 are disposed on a silicon layer 320 while raised silicon 350 is disposed on silicon layer 205 within substrate region 308. In exemplary embodiments, III-N semiconductor fins 230C are substantially monocrystalline having the hexagonal c-axis substantially orthogonal to the (111) plane of silicon layer 320. In other words, the c-plane of the III-N material is no more than 10° from parallel to the (111) plane of silicon layer 320.

Raised silicon 350 may be grown to a thickness sufficient to be substantially planar with, or extend above, III-N semiconductor fins 230C. Using any conventional epitaxy process, raised silicon 350 may be in-situ impurity doped, for example p-type, and to a desired resistivity. Although in the exemplary embodiment silicon is grown within substrate region 308, it is noted that other materials, such as, but not limited to, SiGe, Ge, and III-V materials (e.g., InP, GaAs, GaP, InGaP, AlGaAs, etc.) may be similarly grown using any technique known to be suitable for the chosen material if devices other than Si FETs are to be hosted by substrate 303.

Within substrate region 306, a polarization layer 236 is disposed directly on a layer of a III-N semiconductor fin 230C. Polarization layer 236 is advantageously disposed on a GaN portion of III-N semiconductor fin 230C for high carrier mobility, however it may also be disposed on an alternative III-N material also employed as the seeding surface for TMDC layer 235. If GaN is not substantially matched to TMDC layer 235, but is desired for region 306, GaN may be selectively grown along with polarization layer 236 over III-N fin material also employed as the seeding surface for TMDC layer 235.

In some exemplary embodiments, polarization layer 236 includes at least one of an AlGaN and/or AlN and/or AlInN layer. Polarization layer 236 may have a z-thickness of 3-30 nm, for example. Where disposed on the c-plane (0001) surface, polarization layer 236 induces a 2 DEG of high charge density and mobility within III-N semiconductor fin 230C proximate to the interface of polarization layer 236. A 2 DEG may therefore be absent from sidewalls of fins 230C. Within substrate region 307, TMDC layer 235 is disposed directly on a top surface of III-N semiconductor fins 230C. TMDC layer 235 may have any of the compositions and/or film properties described above. TMDC layer 235 disposed on one or more of the top surface and sidewalls of fins 230C may be functional as a device layer (e.g., suitable as a channel of a FET). For a given footprint on substrate 303, TMDC device density and/or current carrying transistor width may be greater than that of III-N device(s). In some alternative embodiments, TMDC layer 235 is disposed directly on a top surface of III-N polarization layer 236, which may have been grown unselectively in both regions 306 and 307 as having a reasonably well-matched lattice parameter to that of TMDC layer 235. For some such embodiments, rather than facilitating lateral device integration as shown in FIG. 3C, vertical device integration is facilitated with a TMDC layer/polarization layer stack disposed on III-N fins 230C. A TMDC-channeled transistor may then be stacked on top of a GaN-channeled transistor with polarization layer 236 disposed there between.

Any known silicon epitaxial processes, III-N epitaxial processes, and TMDC epitaxial processes (e.g., CVD, ALD, and MBE) may be employed to form substrate 303. With the structure illustrated in FIG. 3C, substrate 303 is ready to host an SOC with one or more III-N devices in region 306, one or more TMDC devices in region 307, and one or more silicon devices in region 308. Although FIG. 3C illustrates a silicon SOI base substrate to facilitate III-N growth with a (111) silicon layer, it is noted that device regions 306, 307, and 308 may also be provided on a bulk silicon substrate with a single silicon layer (e.g., layer 205), for example with III-N semiconductor fins 230C and raised silicon 350 disposed on a (100) silicon seeding surface.

Substrates 301, 302 and 303 may be selected as a function of the SOC application. For example, substrate 303 may be particularly well suited for integration of n-channel Si double-gate and/or tri-gate transistors within region 308 and p-channel TMDC transistors within region 307. The combination of which may implement CMOS logic circuitry. Higher-voltage circuitry may be implemented in n-channel III-N (e.g., GaN) devices within region 306. In another exemplary embodiment, substrate 302 is employed for the integration of light emitting and/or photonic TMDC devices within region 307 while n-channel and/or p-channel FETs implement control circuitry within region 308. Higher-voltage drive circuitry may be further implemented in n-channel III-N (e.g., GaN) devices within region 306.

Noting TMDC devices employ a monolayer architecture, contact resistance can pose a significant challenge for such devices. For example, high source/drain contact resistances can degrade on-current and/or other operating characteristics of a TMDC device (e.g., transistor). In some embodiments therefore, a TMDC device includes impurity doped (e.g., n+) III-N semiconductor contacts. For such embodiments, the doped III-N material forms a heterojunction interface with one or more surface of a TMDC layer, and TMDC device contact metallization interfaces with the doped III-N material. TMDC devices in accordance with such embodiments therefore include at least one terminal electrically coupled through a doped III-N heterojunction. Such a source/drain architecture lends itself to integration with III-N transistors that also employ impurity-doped III-N source/drain material.

Impurity-doped III-N source/drain material advantageously has a bandgap offset from TMDC material that is advantageous for interfacing ohmic contact metallization. In some embodiments, III-N material has a type-I band offset from TMDC material in which the conduction and valance bands of the wider band gap III-N material (e.g., GaN $E_g$ of 3.4 eV) straddle the narrower band gap of the TMDC material (e.g., $MoS_2$ $E_g$ of 1.8 eV). This is an excellent condition for an n-type or p-type doped III-N source and drain as charge carriers may be supplied to a TMDC transistor channel disposed there between. Electrons in the III-N conduction band, for example, will lose potential energy as they drop down into the conduction band of the TMDC channel without any resistance or barrier at the TMDC/doped III-N source heterojunction. Moreover, since electrons in the doped III-N source have a higher potential energy, they are launched into the TMDC channel, potentially enhancing the performance of a TMDC transistor. Furthermore, a type-I band offset at the drain may advantageously reduce gate induce drain lower (GIDL) effects of a TMDC transistor, which may reduce device leakage currents. Although may be somewhat more difficult to dope III-N materials highly p-type, the type-I band offset between III-N material and TMDC material can nevertheless provide similar benefits in further embodiments where a p-type TMDC device is coupled through p-type doped (e.g., Mg) III-N material.

Figure 4A:
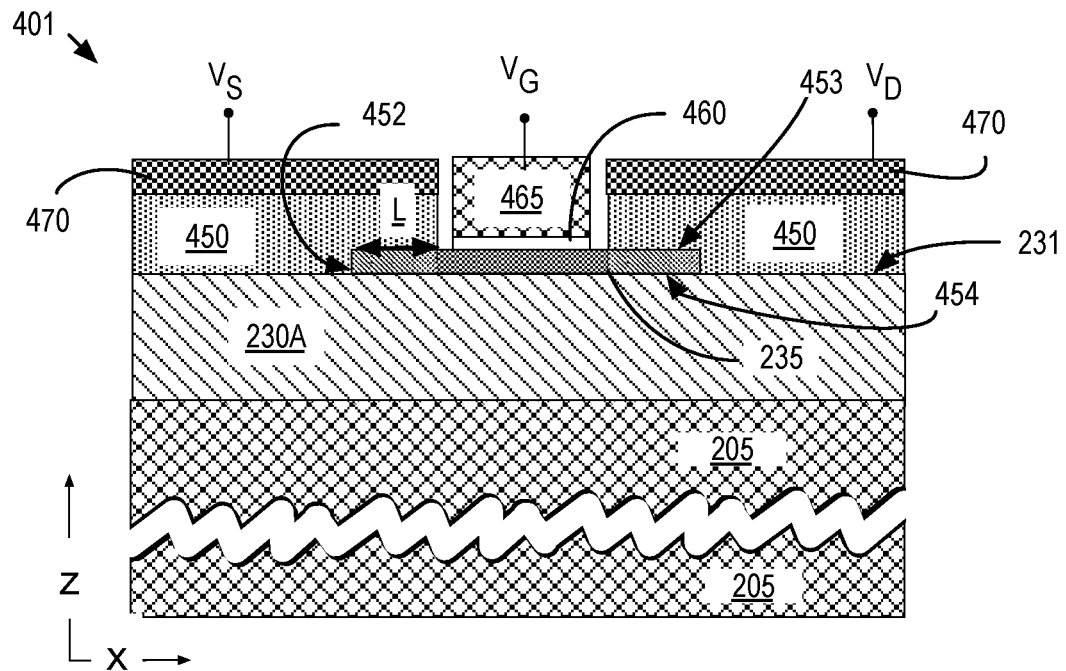
FIGS. 4A, 4B and 4C depict cross-sectional views of an n-type TMDC field effect transistor employing a doped III-N source and drain, in accordance with some embodiments.
Figure 4B:
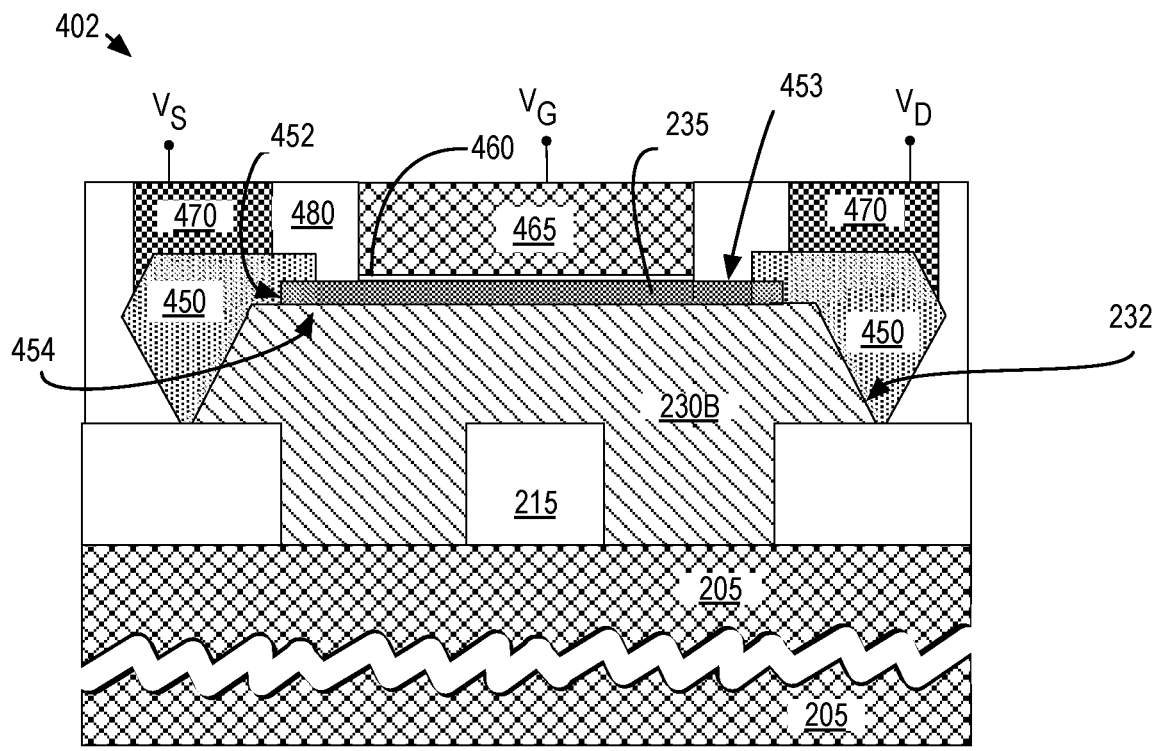
Figure 4C:
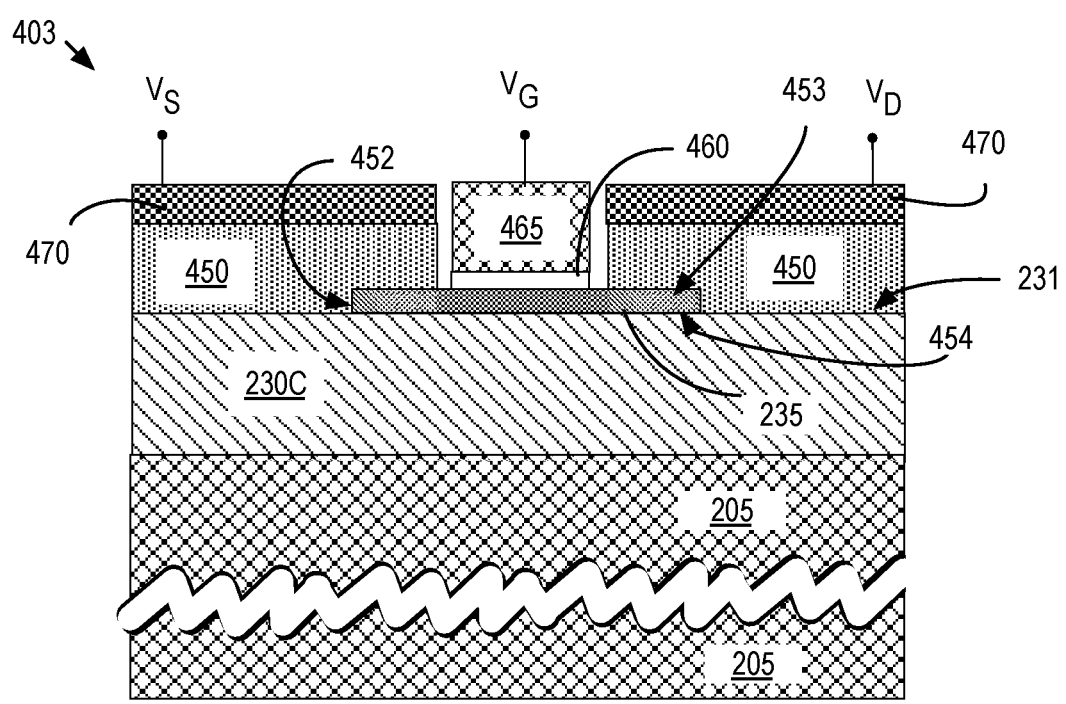

FIGS. 4A, 4B and 4C depict cross-sectional views of an n-type TMDC field effect transistor employing a doped III-N source and drain, in accordance with some embodiments. In FIG. 4A, a TMDC FET 401 includes monocrystalline TMDC layer 235 disposed on substantially lattice matched surface of monocrystalline III-N semiconductor layer 230A disposed over monocrystalline silicon layer 205. In some embodiments, TMDC layer 235, III-N semiconductor layer 230A and silicon layer 205 are portions of a TMDCOGOS substrate, such as substrate 201 illustrated in FIG. 2A. In FIG. 4B, a TMDC FET 402 includes monocrystalline TMDC layer 235 disposed on a substantially lattice-matched surface of monocrystalline III-N semiconductor body 230B disposed over monocrystalline silicon layer 205. In some embodiments, TMDC layer 235, III-N semiconductor body 230B and silicon layer 205 is a portion of a TMDCOGOS substrate, such as substrate 202 illustrated in FIG. 2B. In FIG. 4C, a TMDC FET 402 includes monocrystalline TMDC layer 235 disposed on a substantially lattice-matched surface of monocrystalline III-N semiconductor fin 230C disposed over monocrystalline silicon layer 205. In some embodiments, TMDC layer 235, III-N semiconductor fin 230C and silicon layer 205 is a portion of a TMDCOGOS substrate, such as substrate 203 illustrated in FIG. 2C, in which case the cross-sectional view depicted in FIG. 4C is orthogonal to that illustrated in FIG. 2C, and through a longitudinal length of III-N fin 230C).

In each of the embodiments illustrated in FIG. 4A-4C, TMDC layer 235 includes a channel region disposed below a gate stack. In the exemplary embodiments, the gate stack includes a gate electrode 465 separated from the TMDC channel region by an intervening gate dielectric 460. Gate dielectric 460, if present, may be any high-k material known to be suitable for TMDC FETs. In some exemplary embodiments, gate dielectric 460 is at least one layer of $HfO_2$, $HfAlO_x$, $HfSiO_x$. Gate electrode 465 may be any material known to be suitable for TMDC FETs. In some exemplary embodiments, gate electrode 465 is a metal having a suitable work function to provide either enhancement or depletion mode operation. Disposed on opposite sides of the gate stack is a pair of impurity-doped III-N source/drain regions 450. Contact metallization 470 is further disposed on doped III-N source/drain regions 450.

In some exemplary embodiments, impurity-doped III-N source/drain regions 450 are doped to one conductivity type (e.g., both source and drain are doped n-type) with an impurity species, such as silicon. III-N source/drain region 450 is advantageously monocrystalline. In some embodiments, III-N source/drain 450 is alloyed with group III species to lattice match to a seeding surface of III-N layer 230A and/or a seeding surface of TMDC layer 235. Such alloying may be graded over a thickness of a doped III-N source/drain 450, for example from low In content at an interface with TMDC layer 235 and III-N layer 230A to a higher In content (e.g., 60% In) at an interface with contact metallization 470. Alternatively, where group III composition is not graded within the doped III-N source/drain regions 450, a fixed In % may be selected to provide both a sufficiently low specific contact metallization resistance and maintain a non-blocking conduction band offset with TMDC material layer 235. For example, a 60% In InGaN source/drain material will have conduction bands nearly aligned with a $WS_2$ layer.

In some embodiments, doped III-N source/drain region 450 is in contact with at least a sidewall or edge surface of TMD C layer 235 in a region beyond the transistor channel. For exemplary embodiments illustrated in FIG. 4A-4C, doped III-N source/drain region 450 is disposed on a sidewall surface (e.g. m-plane) 452 of TMDC layer 235 and also disposed on a III-N material surface adjacent to TMDC layer 235. Because TMDC layer 235 is a monolayer in exemplary embodiments, contact between doped III-N source/drain region 450 and sidewall TMDC surface 452 alone may result in higher contact resistance than for embodiments where the doped III-N source/drains laterally overlap the TMDC to further provide contact area between doped III-N source/drain region 450 and either a top TMDC surface 453, or bottom TMDC surface 454. In the exemplary embodiments illustrated in FIG. 4A-4C, doped III-N source/drain region 450 is also disposed on top TMDC surface (e.g. c-plane) 453. Lateral dimensions (length L shown in FIG. 4A) of the source/drain interfacing top surface 453 may be predetermined to achieve a desired contact resistance. In further embodiments (not depicted) doped III-N source/drain region 450 may be disposed below bottom TMDC surface 454. For such embodiments, at least a portion of doped III-N material may be formed prior to TMDC layer 235, with a non-channel portion of TMDC layer 235 grown on the doped III-N material. Alternatively, III-N material 230A, 230B, or 230C may be selectively recessed to undercut a portion of TMDC layer 235 beyond the channel region, and doped III-N material backfilled into the recesses.

Figure 5A:
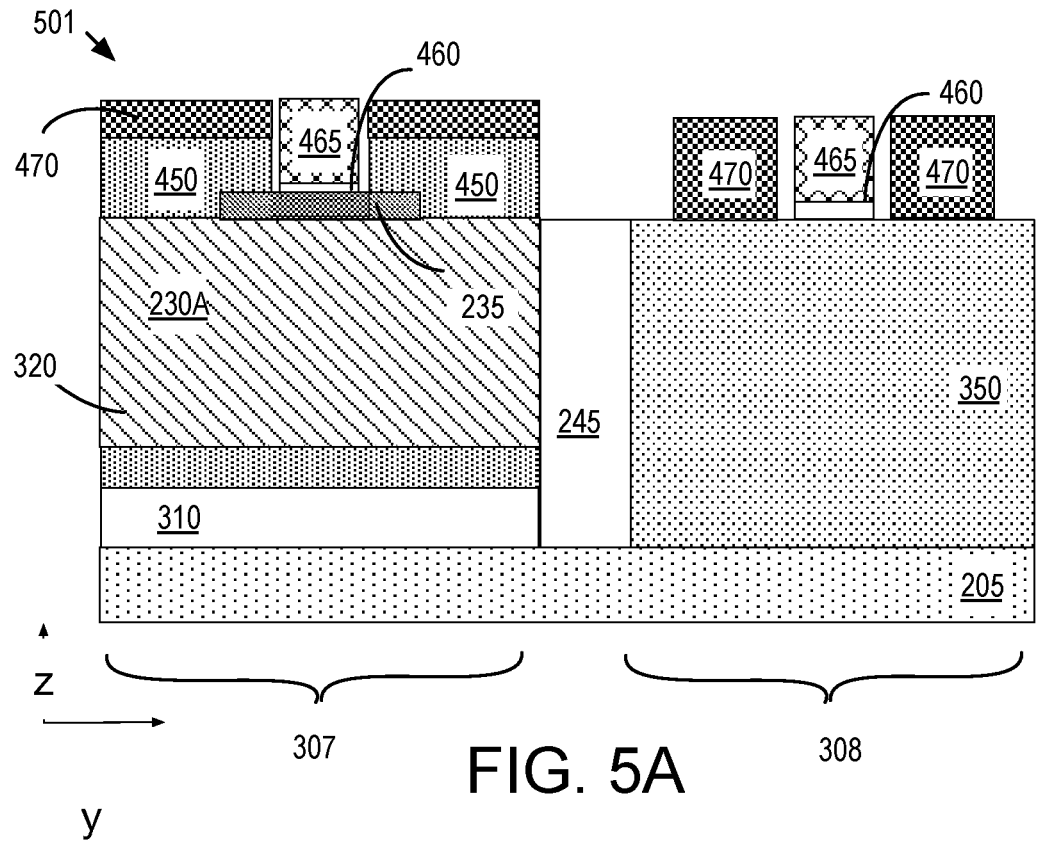
FIGS. 5A and 5B further illustrate cross-sectional views of an SOC including both silicon transistors and TMDC transistors, in accordance with some embodiments.
Figure 5B:
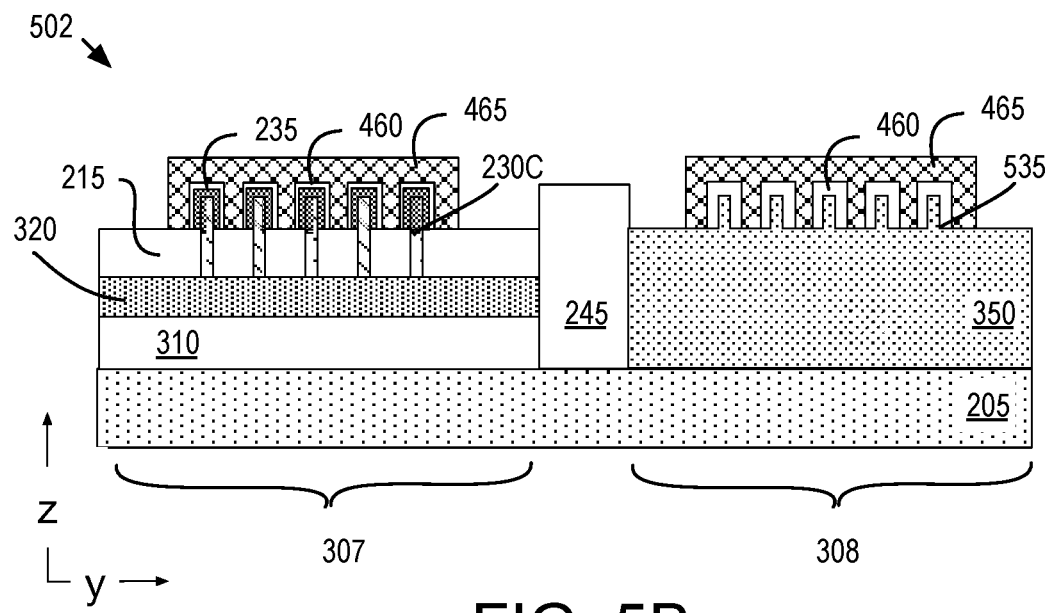

FIGS. 5A and 5B further illustrate cross-sectional views of an SOC including both silicon transistors and TMDC transistors, in accordance with some embodiments. In the exemplary embodiment illustrated in FIG. 5A, an SOC 501 includes a planar TMDC transistor within first substrate region 307 and a planar silicon transistor within second substrate region 308. In some embodiments, SOC 501 employs TMDCOGOS substrate 301 (FIG. 3A). In the exemplary embodiment illustrated in FIG. 5B, an SOC 502 includes a non-planar TMDC transistor within first substrate region 307 and a non-planar silicon transistor within second substrate region 308. In some embodiments, SOC 502 employs TMDCOGOS substrate 303 (FIG. 3C). Each of the TMDC-channeled and Si-channel transistors include a gate stack and source/drain contact metallization 470. Gate stacks include gate dielectric 460 and gate electrode 465, which may be the same or different materials for the TMDC-channel and Si-channel transistors. The non-planar silicon transistors include non-planar silicon fins 535 in conformance with any known double-gate, tri-gate, or gate-all-around architecture. Non-planar TMDC transistors include non-planar III-N fins 230C in conformance with any of the embodiments described above. The gate stack wraps around TMDC material disposed on at least two sidewalls of fins 230C with source/drain material (e.g., doped n+ III-N material) out of the page in FIG. 4C.

Although not illustrated in FIGS. 5A and 5B, III-N transistors may also be integrated with TMDC transistors and silicon transistors. For embodiments where a TMDC transistor is integrated with a III-N transistor (e.g., on substrate 302 shown in FIG. 3B), the architecture of the III-N transistor may be very similar to the architecture of the TMDC transistor (e.g., as illustrated in FIG. 4A-4B), for example with the TMDC monolayer replaced with a III-N polarization layer. Alternatively, a common structure including a TMDC monolayer and III-N polarization layer stack may be employed in each of a TMDC transistor and III-N transistor, with a gate electrode coupling to either or both of a TMDC channel or III-N channel. The same doped III-N material employed for a TMDC transistor source/drain may also be employed for a III-N transistor source/drain of the same conductivity type. Likewise the same contact metallization may be employed for both transistors. Gate stacks between the TMDC and III-N transistor may be the same or different (e.g., a same gate dielectric but different electrode material, a same gate dielectric and same gate electrode material, a different gate dielectric but same gate electrode material, or different gate dielectric and different gate electrode material). Processing of the TMDCOGOS substrates may be such that the various TMDC, III-N and Si transistors are all fabricated on a substantially planar substrate surface.

Figure 6A:
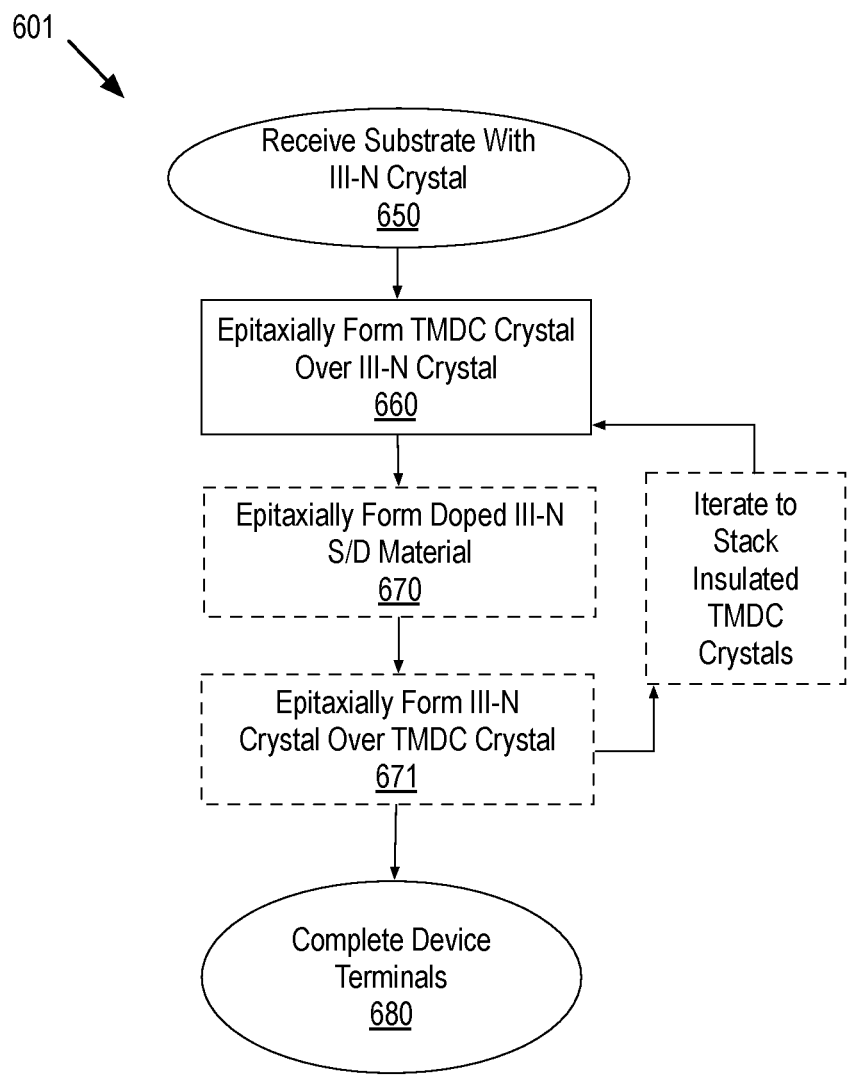
FIG. 6A is a flow diagram illustrating a method for fabricating a TMDC device on a III-N crystal, in accordance with some embodiments.

The semiconductor heterostructures, substrates, and semiconductor devices described above may be fabricated using a variety of methods. FIG. 6A is a flow diagram illustrating a method 601 for fabricating a TMDC device on a III-N crystal, in accordance with some embodiments. Method 601 begins with receiving a substrate including a GaN crystal at operation 650. While any substrate including a GaN crystal may be received, in some advantageous embodiments the substrate is a GOS substrate, such one having one or more of the structural features of those described above. At operation 660, a TMDC crystal is epitaxially formed over the GaN crystal, employing a surface of the GaN crystal as an epitaxially seeding surface. Any known deposition process known to be suitable for forming a monocrystalline TMDC layer on a substantially lattice-matched III-N seeding surface may be employed at operation 660. III-N materials are very robust with decomposition temperatures exceeding 900° C., so most TMDC deposition processes are compatible with a III-N seeding surface. In some exemplary embodiments, operation 660 entails a CVD, ALD, or MBE growth of a TMDC material. In one such embodiment, a TMDC monolayer is grown by exposing a (0001) surface of a lattice matched III-N material to gaseous precursors at elevated substrate temperatures. For example, a $MoSe_2$ monolayer may be grown by exposing a (0001) surface of lattice matched III-N material to Se, $H_2$, and $MoO_3$ while the substrate is heated to at least 900° C. As another example, a $WSe_2$ monolayer may be grown by exposing a (0001) surface of lattice matched III-N material to Se, $H_2$, and $WO_3$ while the substrate is heated to at least 900° C. For such embodiments, the metal will react with the chalogen to form a monolayer and liberate water vapor.

Optionally, as denoted by the dashed box, method 601 further includes operation 670, where an impurity-doped III-N material is grown over at least a portion of the TMDC layer grown at operation 670. Growth operation 670 may form the doped III-N source/drain regions 450 described above, for example. In some embodiments, III-N source/drain growth at operation 670 entails at least partially masking off the TMDC layer and growing impurity doped III-N material on exposed III-N and/or TMDC seeding surface(s). For example, a portion of a TMDC layer (e.g., a TMDC channel region) is masked off with an amorphous material prior to growth of doped III-N material. Growth of doped III-N material may then proceed off of a III-N seeding surface and/or unmasked TMDC seeding surface.

As growth conditions at operation 670 may be near the point of thermal decomposition for some TMDC materials, growths off of adjacent III-N material may be advantageous. For example, growths off of a homogenous III-N seeding surface may be performed at a higher rate and/or at lower growth temperature than is possible from a heterogeneous TMDC seeding surface. For such embodiments, III-N growth operation 670 may further entail lateral epitaxial overgrowth (LEO) of doped III-N material over an exposed portion of a TMDC layer. Sidewalls of the doped III-N material may then have a slope (e.g., 60-70°) indicative of crystal faceting associated with III-N overgrowth conditions. The presence of doped III-N material over both a TMDC layer and an adjacent III-N material may also indicate a LEO process was employed to form the impurity doped III-N material. In alternative embodiments, while TMDC layer is completely masked with a high-temperature-stable sacrificial material, doped III-N material is grown at operation 670 only on exposed III-N seeding surfaces adjacent to the masked TMDC layer. The doped III-N material grown at operation 670 will then only abut a sidewall of the masked TMDC layer, forming electrical contact only at an edge of the TMDC layer (e.g., contacting TMDC sidewall surface 452, but not TMDC top surface 453 in FIG. 4A-4C). In still other embodiments described in further detail below, the order of operations 660 and 670 is reversed with doped III-N material grown prior deposition of any TMDC material.

Method 601 may also optionally include epitaxially forming a III-N crystal over TMDC crystal at operation 671. A wide band gap III-N material reasonably lattice matched to the TMDC crystal formed at operation 660 may be grown at operation 671. Operations 660 and 671 may then be iterated to grow a vertical stack of TMDC crystals electrically insulated from each other by intervening III-N crystal layers. Each TMDC crystal may be of a different composition, and in some embodiments even include both n-type and p-type TMDC crystals.

Returning to FIG. 6A, method 601 is completed at operation 680 where the TMDC device fabrication is completed. At operation 680 any TMDC device known in the art may be fabricated based on the TMDC layer(s) deposited at operation 660 augmented through the practice of any known techniques. For example, a TMDC n-channel and/or p-channel transistor may be completed at operation 680 by forming a gate stack over the TMDC layer(s) between III-N source/drain regions formed at operation 670. Contact metallization may then be deposited following known methods. In other examples, a photonic device (e.g., light emitting or otherwise) may be completed by forming contact metallization to the TMDC layer through one or more doped III-N regions.

Figure 6B:
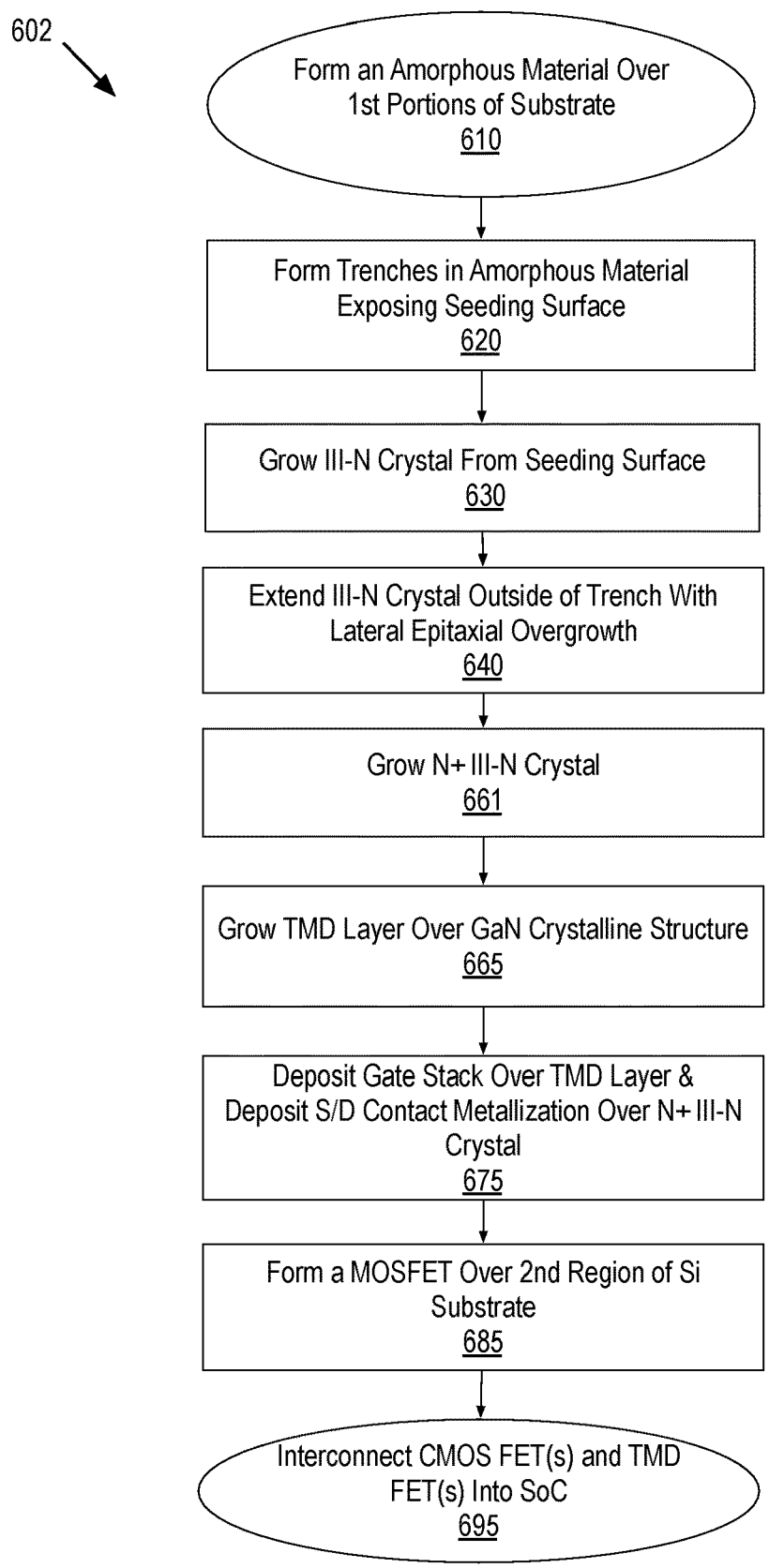
FIG. 6B is a flow diagram illustrating a method for fabricating a TMDCOGOS substrate and fabricating a TMDC-channeled transistor integrated with a Si-channeled transistor on the TMDCOGOS substrate, in accordance with some embodiments.

FIG. 6B is a flow diagram illustrating a method 602 for fabricating a TMDCOGOS substrate and fabricating a TMDC-channeled transistor integrated with a Si-channeled transistor on the TMDCOGOS substrate, in accordance with some embodiments. Method 602 may be practiced to fabricate SOC 501 (FIG. 5A) or SOC 502 (FIG. 5B), for example. FIGS. 7A, 7B, 7C, 7D, 7E, 7F, and 7G are cross-sectional views of a SoC evolving as selected operations in method 602 are performed, in accordance with some embodiments.

Figure 7A:
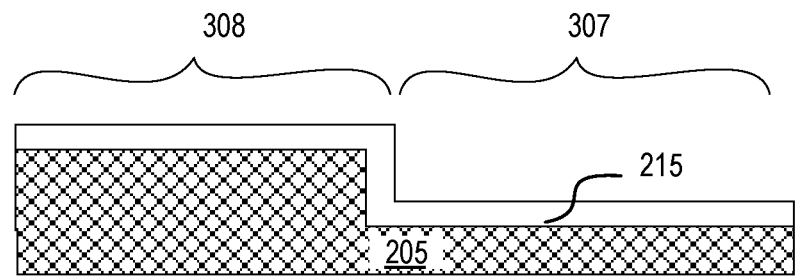
FIGS. 7A, 7B, 7C, 7D, 7E, 7F, and 7G are cross-sectional views of a SoC evolving as selected operations in method illustrated in FIG. 6B are performed, in accordance with some embodiments.

Referring first to FIG. 6, method 601 begins with forming an amorphous material over a first region or portion of a substrate at operation 610. In some embodiments, the substrate is (100) silicon and the amorphous material is a dielectric deposited with any technique known to be suitable for the material. FIG. 7A further illustrates one exemplary embodiment where silicon layer 205 includes both a first (TMDC device) region 307, and a second (Si CMOS) region 308.

At operation 620 (FIG. 6), the amorphous material is patterned to expose a crystalline seeding surface of the substrate. The crystalline seeding surface may be a surface of the bulk substrate or of some interfacial material of the substrate. For some embodiments, the amorphous material is to serve both as a template for a subsequent III-N epitaxial growth, and further as a mask confining subsequent overgrowth of doped III-N source/drain material. Any pattern transfer technique may be utilized at operation 620. The template structures, for example, expose stripes of a (100) silicon surface.

Figure 7B:
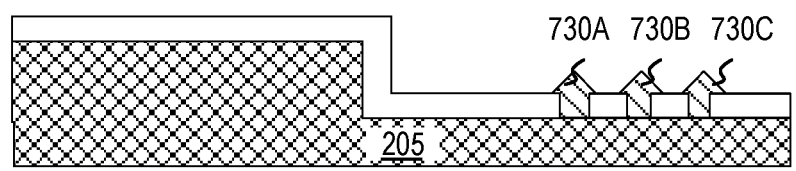
Figure 7C:
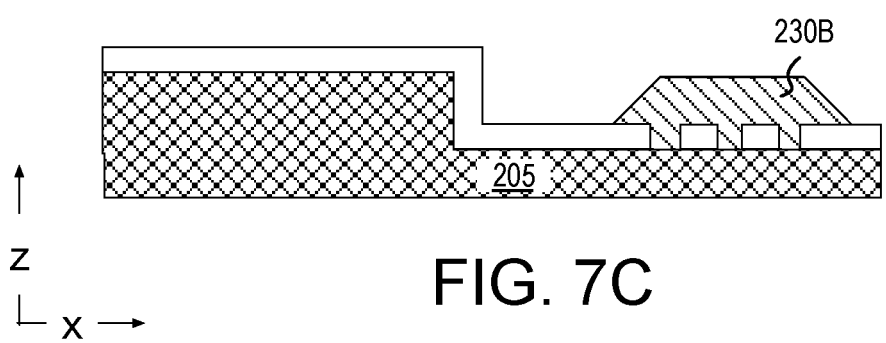

At operation 630, III-N material (e.g., GaN) is epitaxially grown from the exposed seeding surface to backfill the template structure (e.g., backfill the trench stripes). Material growth may be by any known technique, such as, but not limited to metal-organic chemical vapor deposition (MOCVD), or molecular beam epitaxy (MBE). In some embodiments, elevated temperatures of 900° C., or more, are employed at operation 630 to epitaxially grow a GaN crystalline body. When the template structure is backfilled (i.e., amorphous material planarized), growth conditions may be changed to favor LEO of the III-N crystalline structure over the amorphous template material at operation 640. In some embodiments, the LEO process employed at operation 640 favors formation of inclined sidewall facets and forms a III-N material of a composition that is substantially lattice matched to a desired TMDC crystal. FIG. 7B, further illustrates amorphous material 215 patterned into a template structure and backfilled by III-N islands 730A, 730B, 730C that are beginning to laterally overgrow amorphous material 215.

Lateral overgrowth at rates that favor hexagonal crystal facets non-parallel and non-normal to the c-plane have been found to bend defects away from the c-plane and toward the sidewalls such that quality of a top surface (0001) of the III-N crystalline structure improves with overgrowth time. In the exemplary embodiment further illustrated in FIG. 7C, upon termination of operation 640, peaks 730A-C have expanded into trapezoidal profiles eventually merged into monocrystalline III-N body 230B.

Figure 7D:
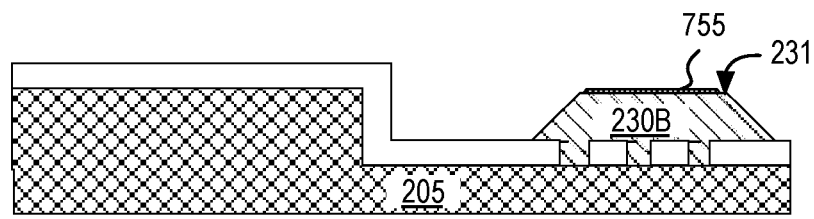
Figure 7E:
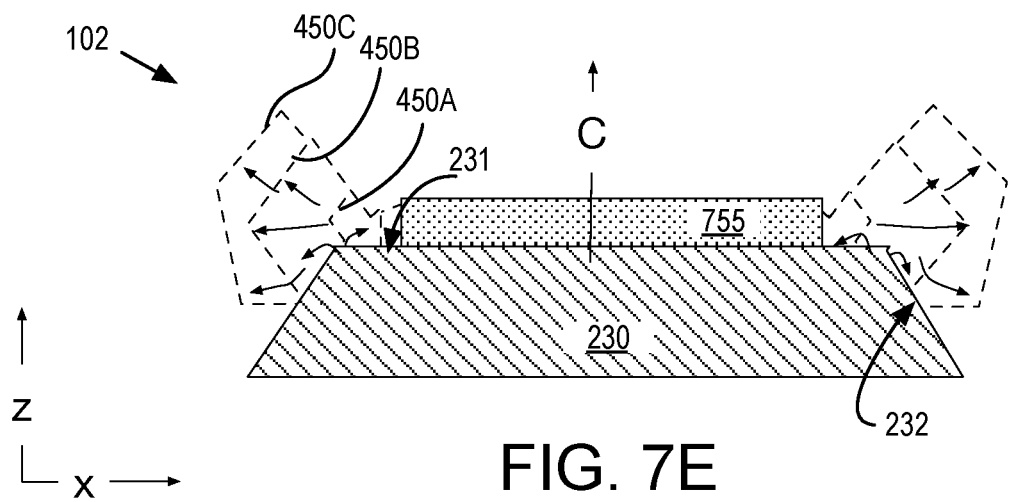

Returning to FIG. 6, at operation 661, impurity-doped (e.g., n+) III-N source/drain material is grown from a III-N material seeding surface. In some embodiments, a channel portion of III-N material is masked with an amorphous material to confine growth of the III-N source/drain material. For example, FIG. 7D illustrated as amorphous material 755 deposited and patterned to reveal only a portion of top III-N surface 231. The impurity-doped III-N crystalline source/drain material may then be grown with any epitaxial process known to be suitable for the chosen source/drain material. In some embodiments, Si-doped InGaN is grown by MOCVD, MBE, or the like. In some embodiments, doped III-N crystalline source/drain material is initially grown with conditions that favor growth from the c-plane of exposed III-N body 230B. Subsequently, a LEO process is performed to laterally overgrow the doped III-N crystalline source/drain material over a sidewall portion of III-N crystalline body 230B, as illustrated in the expanded view provided in FIG. 7E. Arrows depicted in FIG. 7E represent advancement of the doped III-N material growth front demarked by dashed lines 450A, B, C. In some embodiments where the LEO process is sufficiently long, the doped III-N crystalline source/drain material may be laterally grown over at least a portion of the amorphous mask formed at operation 661. As further illustrated in FIG. 7E, doped III-N (e.g., n+ InGaN) monocrystalline source/drain material 450 is laterally overgrown from nucleation site(s) on top surface 231, wrapping down a sidewall of III-N crystalline body 230B. Following source/drain III-N growth, the mask material 755 may be stripped with any known process.

Figure 7F:
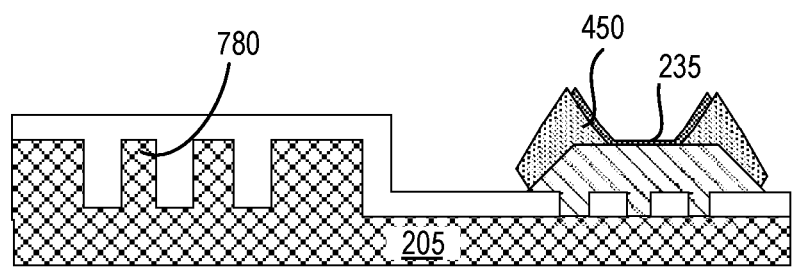
Figure 7G:
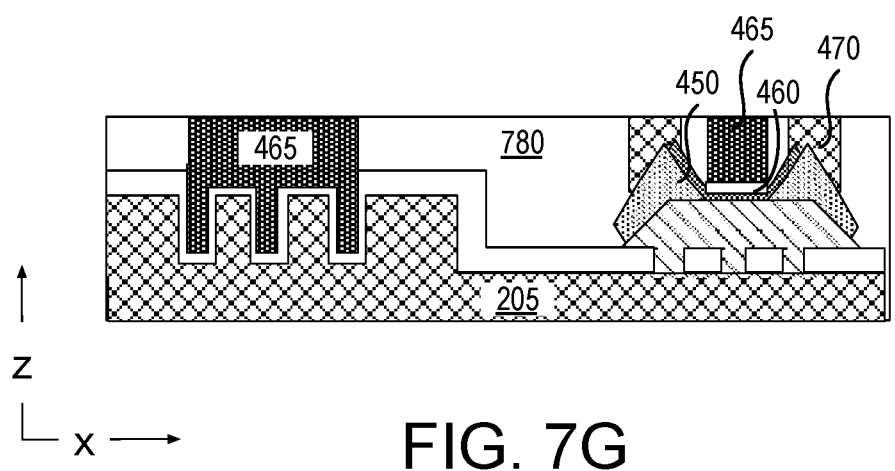

Returning to FIG. 6, at operation 665, a TMDC layer is grown over the III-N body 230B formed by at operation 640. Any conventional TMDC process may be employed to form a TMDC crystal at operation 665. In some embodiments, a TMDC crystal layer is grown from at least the c-plane of the raised III-N crystalline body 230B. FIG. 7F further illustrates a growth of TMDC layer 235 on surfaces of the III-N body 230B as well as on surfaces of doped III-N source/drain material 450. Non-planar silicon fins 780 may be formed in substrate region 308 using any known technique before or after formation of TMDC layer 235.

Method 601 continues at operation 675 where a gate stack is deposited over the TMDC layer within the transistor channel region. Source/drain metallization is further contacted to the raised doped III-N source/drain material formed at operation 661. In the exemplary embodiment further illustrated in FIG. 7G, formation of the gate stack further entails deposition of a gate dielectric 460 and deposition of a gate electrode 465 within the recess between source/drain regions 450. Any known dielectric deposition process, such as CVD and ALD may be utilized to form the gate dielectric. Any known metal deposition process, such as CVD, ALD, and/or PVD may be utilized to form the gate electrode. ILD 780 may be further deposited and/or planarized before or after formation of the gate stack. Any known technique may then be utilized to form contact metallization 470 contacting III-N source/drain regions 450.

Method 601 (FIG. 6) continues at operation 685, a where silicon-based MOSFET is formed over the substrate. Any known MOSFET fabrication process may be enlisted at operation 680. In the exemplary embodiment further illustrated in FIG. 7G, a non-planar MOSFET (e.g., finFET) including gate dielectric 460 and gate electrode 465 is formed using any known technique. In alternate embodiments, a planar MOSFET is formed. Method 601 (FIG. 6) ends at operation 695 with interconnection of silicon-based FET and TMDC-based FET using any known backend metallization process.

Figure 8:
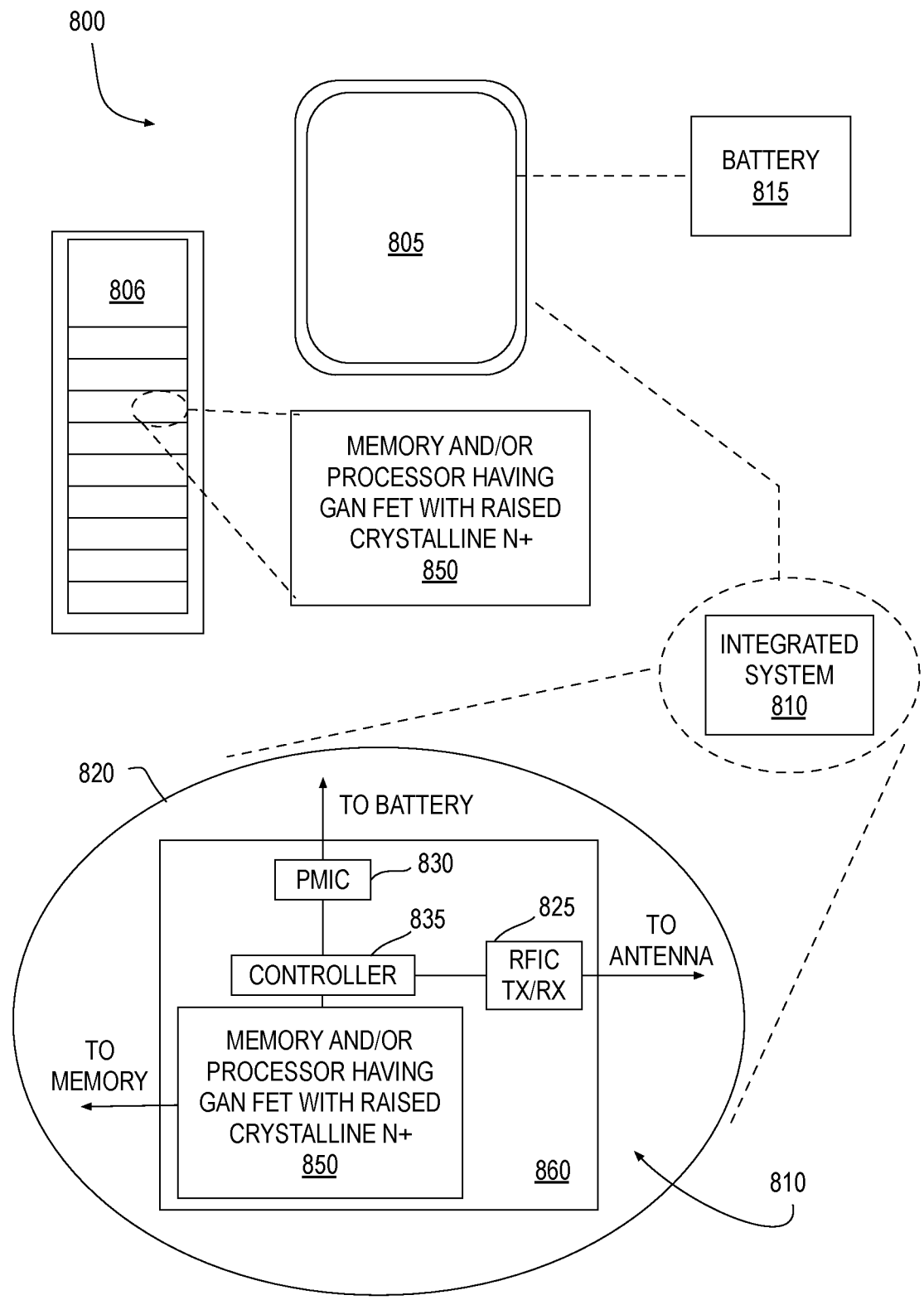
FIG. 8 illustrates a system employing an IC including at least one TMDC device disposed on a III-N crystalline layer, in accordance with some embodiments.

FIG. 8 illustrates a system 800 in which a mobile computing platform 805 and/or a data server machine 806 employs an IC including at least one TMDC device disposed on a III-N crystalline layer, in accordance with some embodiments. The IC may further include a III-N FET in addition to the TMDC device. The server machine 806 may be any commercial server, for example including any number of high-performance computing platforms disposed within a rack and networked together for electronic data processing, which in the exemplary embodiment includes a packaged monolithic IC 850. The mobile computing platform 805 may be any portable device configured for each of electronic data display, electronic data processing, wireless electronic data transmission, or the like. For example, the mobile computing platform 805 may be any of a tablet, a smart phone, laptop computer, etc., and may include a display screen (e.g., a capacitive, inductive, resistive, or optical touchscreen), a chip-level or package-level integrated system 810, and a battery 815.

Whether disposed within the integrated system 810 illustrated in the expanded view 820, or as a stand-alone packaged chip within the server machine 806, packaged monolithic IC 850 includes a memory chip (e.g., RAM), or a processor chip (e.g., a microprocessor, a multi-core microprocessor, graphics processor, or the like) including at least one TMDC device disposed on a III-N crystalline layer, for example as describe elsewhere herein. IC 850 may further include a III-N FET in addition to the TMDC device. The monolithic IC 850 may be further coupled to a board, a substrate, or an interposer 860 along with, one or more of a power management integrated circuit (PMIC) 830, RF (wireless) integrated circuit (RFIC) 825 including a wideband RF (wireless) transmitter and/or receiver (TX/RX) (e.g., including a digital baseband and an analog front end module further comprises a power amplifier on a transmit path and a low noise amplifier on a receive path), and a controller thereof 835.

Functionally, PMIC 830 may perform battery power regulation, DC-to-DC conversion, etc., and so has an input coupled to battery 815 and with an output providing a current supply to other functional modules. As further illustrated, in the exemplary embodiment, RFIC 825 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the monolithic IC 850 or within a single IC coupled to the package substrate of the monolithic IC 850.

Figure 9:
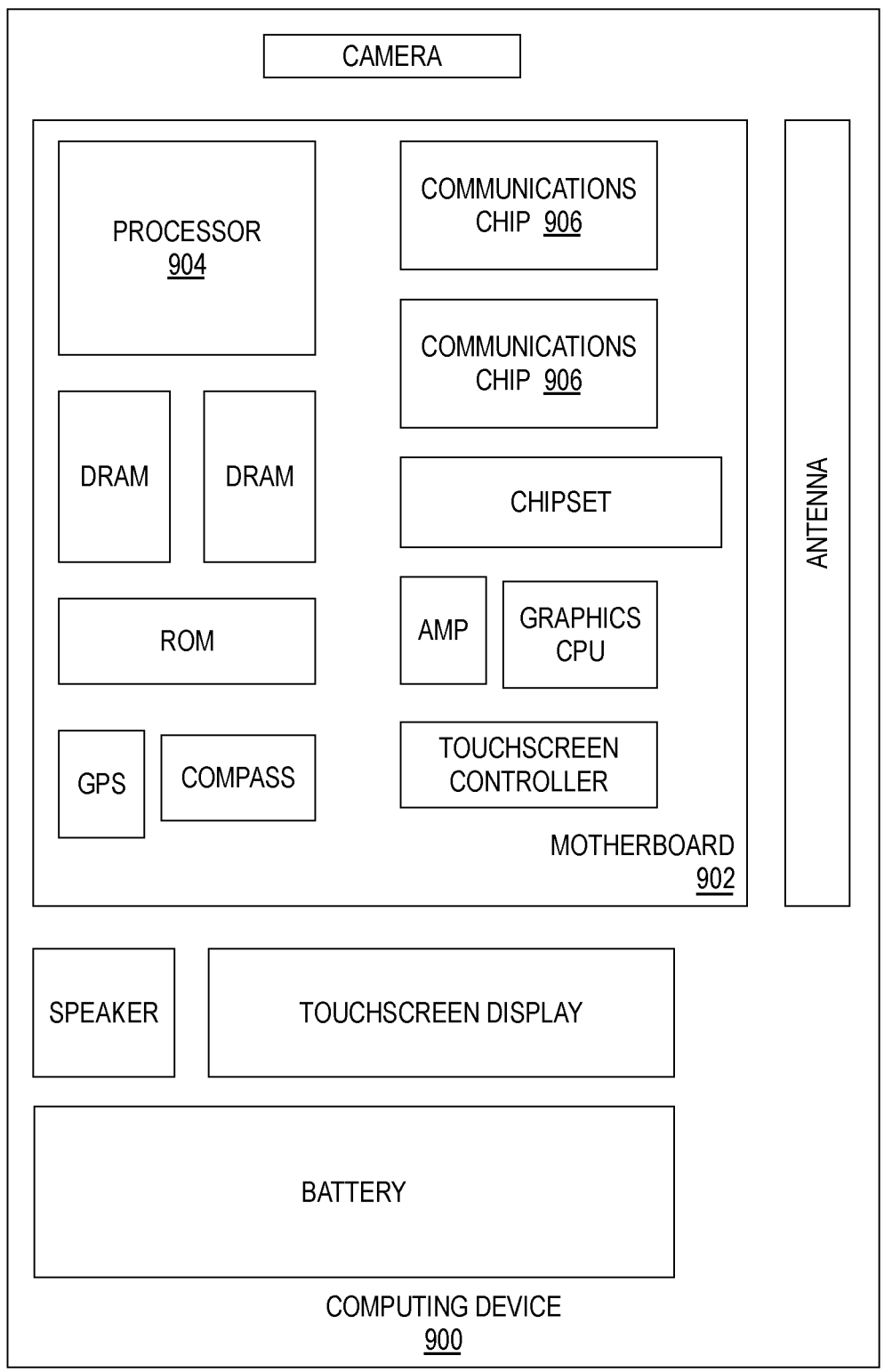
FIG. 9 is a functional block diagram illustrating an electronic computing device, in accordance with an embodiment of the present invention.

FIG. 9 is a functional block diagram of a computing device 900, arranged in accordance with at least some implementations of the present disclosure. Computing device 900 may be found inside platform 805 or server machine 806, for example. Device 900 further includes a motherboard 902 hosting a number of components, such as, but not limited to, a processor 904 (e.g., an applications processor), which may further incorporate at least one TMDC device disposed on a III-N crystalline layer, in accordance with some embodiments. Processor 904 may further include a III-N FET in addition to the TMDC device. Processor 904 may be physically and/or electrically coupled to motherboard 902. In some examples, processor 904 includes an integrated circuit die packaged within the processor 904. In general, the term "processor" or "microprocessor" may refer to any device or portion of a device that processes electronic data from registers and/or memory to transform that electronic data into other electronic data that may be further stored in registers and/or memory.

In various examples, one or more communication chips 906 may also be physically and/or electrically coupled to the motherboard 902. In further implementations, communication chips 906 may be part of processor 904. Depending on its applications, computing device 900 may include other components that may or may not be physically and electrically coupled to motherboard 902. These other components include, but are not limited to, volatile memory (e.g., DRAM), non-volatile memory (e.g., ROM), flash memory, a graphics processor, a digital signal processor, a crypto processor, a chipset, an antenna, touchscreen display, touch-screen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 906 may enable wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 906 may implement any of a number of wireless standards or protocols, including but not limited to those described elsewhere herein. As discussed, computing device 900 may include a plurality of communication chips 706. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In one or more first embodiments, a heteroepitaxial structure, comprises a substrate comprising silicon, a crystalline III-N material disposed over the silicon, and a crystalline transition metal dichalcogenide (TMDC) layer disposed over the III-N material.

In furtherance of the first embodiments, at least a portion of a III-N layer in direct contact with the TMDC has a lattice constant matching to within 1% that of the TMDC layer.

In furtherance of the first embodiments immediately above, the III-N material includes a AlN nucleation layer disposed over the silicon, an intermediate layer disposed over the nucleation layer, the intermediate layer comprising a III-N material having a bandgap at least equal to that of GaN and a film thickness greater than that of the nucleation layer, and a seeding surface layer comprising a III-N material with the lattice constant matching that of the TMDC layer.

In furtherance of the first embodiments, the structure further comprises impurity-doped III-N material in contact with a portion of the TMDC layer.

In furtherance of the first embodiments immediately above, the structure further comprises an impurity-doped III-N source material disposed in contact with a first portion of the TMDC layer, and an impurity-doped III-N drain material in contact with a second portion of the TMDC layer.

In furtherance of the first embodiments immediately above, the first portion of the TMDC layer overlaps the III-N source material and the second portion of the TMDC layer overlaps the III-N drain material.

In furtherance of the first embodiments immediately above, the doped III-N source material is disposed on the first portion of the TMDC layer, and the doped III-N drain material is disposed on the second portion of the TMDC layer.

In furtherance of the first embodiments immediately above, the transition metal comprises at least one of W, Mo, and Hf, the chalcogen comprises at least one of S, Se, and Te, the TMDC layer comprises an odd number of crystal monolayers disposed over the III-N material, the c-axis of the TMDC layer is substantially aligned with the c-axis of the III-N material, and the III-N material is disposed on a (100) surface of the silicon.

In furtherance of the first embodiments, the III-N material interfaces with the silicon at a bottom of a trench defined by an amorphous material disposed over a portion of the silicon, and the III-N material extends laterally over the amorphous material.

In furtherance of the first embodiments, the TMDC layer is disposed over a first region of the substrate, and the structure further comprises a III-N polarization material disposed over the III-N material over a second region of the substrate adjacent to the first region.

In furtherance of the first embodiments immediately above, the structure further comprises a (100) silicon surface over a third region of the substrate adjacent to at least one of the first region or second region.

In furtherance of the first embodiments immediately above, within the second substrate region the III-N material is disposed on a (111) surface of the silicon, and within the third substrate region a dielectric layer is disposed between the (100) silicon surface and the (111) surface of the silicon.

In furtherance of the first embodiments, the structure further comprises a gate stack disposed on a portion of the TMDC layer, contact metallization coupled to first and second portions of the TMDC layer disposed on opposite sides of the gate stack, and impurity doped III-N source/drain material disposed between the contact metallization and the first and second portions of the TMDC layer.

In one or more second embodiments, a monolithic integrated circuit (IC), comprises a substrate comprising, a silicon crystal, a III-N crystal disposed over the silicon crystal, and a transition metal dichalcogenide (TMDC) crystal disposed on the III-N crystal, and the IC includes a first semiconductor device including at least one terminal coupled to the TMDC crystal.

In furtherance of the second embodiments, the IC further comprises a second semiconductor device including at least one terminal coupled to a first of the III-N crystal or the silicon crystal.

In furtherance of the second embodiments immediately above, the first semiconductor device comprises a first transistor including at least three first terminals coupled to the TMDC crystal, the first terminals include a first gate electrode disposed over a channel portion of the TMDC crystal, the second semiconductor device comprises a second transistor including at least three second terminals coupled to the III-N crystal, and the second terminals include a second gate electrode disposed over a channel portion of the III-N crystal.

In furtherance of the second embodiments immediately above, the first terminals include a pair of source/drain metallizations coupled to the TMDC crystal through impurity-doped III-N material disposed on opposite sides of the first gate electrode.

In furtherance of the second embodiments, the IC further comprises a third semiconductor device including at least one terminal coupled to a second of the III-N crystal or the silicon crystal.

In one or more third embodiments, a method of fabricating a transition metal dichalcogenide (TMDC) device comprises receiving a substrate including a III-N crystal, epitaxially forming a TMDC crystal over a surface of the III-N crystal, and forming device terminals coupled to the TMDC crystal.

In furtherance of the third embodiments, a surface of the III-N crystal is lattice matched to that of the TMDC crystal to within 1%, the TMDC crystal comprises an odd number of crystal monolayers disposed over the III-N crystal, the c-axis of the TMDC crystal is substantially aligned with the c-axis of the III-N crystal, and the III-N crystal is disposed on a silicon crystal.

In furtherance of the third embodiments, the TMDC device is a transistor, the method further comprises epitaxially forming impurity-doped III-N source/drain material contacting first and second portions of the TMDC crystal, and forming the device terminals further comprises fabricating a gate stack over the TMDC crystal between the first and second portions, and depositing metallization on the impurity-doped III-N source/drain material.

In furtherance of the third embodiments, the method further comprises forming an amorphous material over first portions of a silicon region of the substrate, forming trenches in the amorphous material exposing a seeding surface of the silicon region, and growing the III-N crystal from the seeding surface and laterally over the amorphous material.

In furtherance of the third embodiments immediately above, the method further comprises growing an impurity-doped III-N material over a portion of the III-N crystal to contact portions of the TMDC crystal.

In furtherance of the third embodiments immediately above, growing the impurity-doped III-N material comprises laterally overgrowing the impurity-doped III-N material from the III-N crystal.

In furtherance of the third embodiments, epitaxially forming the TMDC crystal over a surface of the III-N crystal further comprises growing a TMDC crystal monolayer over a first III-N crystal surface, the method further comprises epitaxially forming a III-N polarization layer over a second III-N crystal surface, and forming the device terminals further comprises fabricating a first gate stack over the TMDC crystal and a second gate stack of the III-N polarization layer, and depositing metallization on impurity- doped III-N source/drain material disposed on the TMDC crystal and at least the second III-N crystal surface.

In furtherance of the third embodiments immediately above, only a first portion of the substrate is covered by the III-N crystal and a second portion of the substrate comprises a (100) silicon surface, and the method further comprises forming a silicon transistor of the (100) silicon surface.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A heteroepitaxial structure, comprising:
   a substrate layer comprising silicon;
   a crystalline III-N material over the substrate layer, wherein the III-N material interfaces with the substrate layer at a bottom of a trench within an amorphous material that is over a portion of the substrate layer, and the III-N material extends laterally over the amorphous material; and
   a layer comprising a transition metal dichalcogenide (TMDC) over the III-N material.

2. The structure of claim 1, wherein at least a portion of the III-N material in direct contact with the layer comprising the TMDC has a lattice constant matching to within 1% a lattice constant of the layer comprising the TMDC.

3. A heteroepitaxial structure, comprising:
   a substrate layer comprising silicon;
   a crystalline III-N material over the substrate layer; and
   a layer comprising a transition metal dichalcogenide (TMDC) over the III-N material, wherein the III-N material includes:
     a nucleation layer over the substrate layer, the nucleation layer comprising Al and nitrogen;
     an intermediate layer over the nucleation layer, the intermediate layer comprising a III-N material having a bandgap at least equal to that of GaN and the intermediate layer having a film thickness greater than that of the nucleation layer; and
     a seeding surface layer comprising a III-N material with a lattice constant approximately matching the lattice constant of the layer comprising the TMDC.

4. A heteroepitaxial structure, comprising:
   a substrate layer comprising silicon;
   a crystalline III-N material over the substrate layer;
   a layer comprising a transition metal dichalcogenide (TMDC) over the III-N material; and
   impurity-doped III-N material in contact with a portion of the TMDC.

5. The structure of claim 4, wherein the impurity-doped III-N material further comprises:
   an impurity-doped III-N source material in contact with a first portion of the layer comprising the TMDC; and
   an impurity-doped III-N drain material in contact with a second portion of the layer comprising the TMDC.

6. The structure of claim 5, wherein the first portion of the layer comprising the TMDC overlaps the III-N source material and the second portion of the layer comprising the TMDC overlaps the III-N drain material.

7. The structure of claim 6, wherein:
the doped III-N source material is on the first portion of the layer comprising the TMDC; and
the doped III-N drain material is on the second portion of the layer comprising the TMDC.

8. The structure of claim 1, wherein:
the transition metal comprises at least one of W, Mo, and Hf;
the chalcogen comprises at least one of S, Se, and Te;
the layer comprising the TMDC comprises an odd number of crystal monolayers over the III-N material;
a c-axis of the layer comprising the TMDC is substantially aligned with a c-axis of the III-N material; and
the III-N material is on a (100) surface of the substrate layer.

9. The structure of claim 1, wherein:
the layer comprising the TMDC is over a first region of the substrate layer; and
the structure further comprises a III-N polarization material over the III-N material within a second region of the substrate layer adjacent to the first region;
a first gate stack is over a portion of the layer comprising the TMDC; and
a second gate stack is over the III-N polarization material.

10. The structure of claim 9, wherein:
the structure further comprises a (100) surface over a third region of the substrate layer adjacent to at least one of the first or second regions.

11. The structure of claim 10, wherein within the second region the III-N material is on a (111) surface of the substrate layer, and within the third substrate region a dielectric material is between the (100) surface and the (111) surface of the substrate layer.

12. The structure claim 4, further comprising:
a gate stack on a portion of the layer comprising the TMDC;
contact metallization coupled to first and second portions of the layer comprising the TMDC on opposite sides of the gate stack; and
wherein the impurity doped III-N material is between the contact metallization and the first and second portions of the layer comprising the TMDC.

13. An integrated circuit (IC) structure, comprising:
a silicon crystal;
a III-N crystal over the silicon crystal;
a transition metal dichalcogenide (TMDC) crystal on the III-N crystal; and
a transistor structure including source and drain terminals that are coupled to the TMDC crystal through impurity-doped III-N material.

14. The IC structure of claim 13, further comprising a second transistor structure including at least one terminal coupled to a first of the III-N crystal or the silicon crystal.

15. The IC structure of claim 13, wherein:
the transistor structure further comprises a gate electrode between the source and drain terminals and over a channel portion of the TMDC crystal.

16. The IC structure of claim 14, further comprising a third transistor structure including at least one terminal coupled to a second of the III-N crystal or the silicon crystal.

17. A method of fabricating a transition metal dichalcogenide (TMDC) device, the method comprising:
receiving a substrate including a III-N crystal on a silicon crystal;
epitaxially forming a TMDC crystal over a surface of the III-N crystal wherein a c-axis of the TMDC crystal is substantially aligned with a c-axis of the III-N crystal and a c-plane lattice constant a of the TMDC and III-N crystal is matched to within 1%; and
forming device terminals coupled to the TMDC crystal.

18. The method of claim 17, wherein:
the TMDC crystal comprises an odd number of crystal monolayers over the III-N crystal.

* * * * *